(12) United States Patent
Galton et al.

(10) Patent No.: US 11,437,980 B2
(45) Date of Patent: Sep. 6, 2022

(54) FREQUENCY TO DIGITAL CONVERTER, ASYNCHRONOUS PHASE SAMPLER AND DIGITALLY CONTROLLED OSCILLATOR METHODS

(71) Applicant: The Regents of the University of California, Oakland, CA (US)

(72) Inventors: Ian Galton, Del Mar, CA (US); Enrique Alvarez-Fontecilla, San Diego, CA (US); Amr Eissa, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/109,624

(22) Filed: Dec. 2, 2020

(65) Prior Publication Data

US 2021/0175878 A1  Jun. 10, 2021

Related U.S. Application Data

(60) Provisional application No. 62/944,797, filed on Dec. 6, 2019.

(51) Int. Cl.

| H03K 3/03 | (2006.01) |
|---|---|
| H03M 3/00 | (2006.01) |
| H03L 7/085 | (2006.01) |
| H03L 7/093 | (2006.01) |
| H03L 7/197 | (2006.01) |

(Continued)

(52) U.S. Cl.
CPC ........... *H03K 3/0315* (2013.01); *H03L 7/085* (2013.01); *H03L 7/093* (2013.01); *H03L 7/197* (2013.01); *H03M 3/496* (2013.01); *H03M 7/3026* (2013.01); *H03L 2207/50* (2013.01); *H04B 1/40* (2013.01); *H04B 10/00* (2013.01)

(58) Field of Classification Search
CPC ..... H04B 10/00; H03L 2207/50; H03L 7/197; H03L 7/085; H03L 7/093; H03K 3/0315; H03M 3/496; H03M 7/3026
USPC ..................... 331/1 A, 57; 327/156; 375/376
See application file for complete search history.

(56) References Cited

U.S. PATENT DOCUMENTS

2020/0067514 A1*  2/2020  Galton ................. H03L 7/0991

OTHER PUBLICATIONS

Hsu et al., "A Low-Noise Wide-BW 3.6-GHz Digital ΔΣ Fractional-N Frequency Synthesizer With a Noise-Shaping Fime-to-Digital Converter and Quantization Noise Cancellation", IEEE Journal of Solid-State Circuits, Dec. 2008, pp. 2776-2786, vol. 43, No. 12, IEEE.

(Continued)

*Primary Examiner* — Arnold M Kinkead
(74) *Attorney, Agent, or Firm* — Greer, Burns & Crain, Ltd.; Steven P. Fallon

(57) ABSTRACT

A ΔΣ frequency to digital converter includes digital feedback to an accumulator in a ring phase calculator that provides the converter output, which reduces implantation complexity. Digital gain correction is applicable to dual mode ring oscillator converters and charge pump converters, provides compensation for forward path gain error and eliminates the need to include analog gain correction in feedback. Asynchronous sampling includes correction logic to compensate for arbitrary initial conditions. A digitally-controlled oscillator (DCO) control technique causes the DCO frequency to increase or decrease by changing the state of one its frequency control elements at a time.

19 Claims, 15 Drawing Sheets

(51) Int. Cl.
   *H03M 7/36*   (2006.01)
   *H04B 1/40*   (2015.01)
   *H04B 10/00*  (2013.01)

(56) References Cited

OTHER PUBLICATIONS

Weltin-Wu et al., "A Highly-Digital Frequency Synthesizer Using Ring-Oscillator Frequency-to-Digital Conversion and Noise Cancellation", 2015 IEEE International Solid-State Circuits Conference, Session 25, Digest of Technical Papers, 2015, pp. 438-440, IEEE.

Wang et al., "Spurious Tone Suppression Techniques Applied to a Wide-Bandwidth 2.4 GHz Fractional-N PLL", IEEE Journal of Solid-State Circuits, Dec. 2008, pp. 2787-2797, vol. 43, No. 12, IEEE.

Venerus et al., "Delta-Sigma FDC Based Fractional-N PLLs", IEEE Transactions on Circuits and Systems—I: Regular Papers, May 2013, pp. 1274-1285, vol. 60, No. 5, IEEE.

Riley et al., "Delta-Sigma Modulation in Fractional-N Frequency Synthesis", IEEE Journal of Solid-State Circuits, May 1993, pp. 553-559, vol. 28, No. 5, IEEE.

Weltin-Wu et al., "A Linearized Model for the Design of Fractional-N Digital PLLS Based on Dual-Mode Ring Oscillator FDCs", IEEE Transactions on Circuits and Systems—I: Regular Papers, Aug. 2015, pp. 2013-2023, vol. 62, No. 8 IEEE.

Weltin-Wu et al., "A 3.5 GHz Digital Fractional-N PLL Frequency Synthesizer Based on Ring Oscillator Frequency-to-Digital Conversion", IEEE Journal of Solid-State Circuits, Dec. 2015, pp. 2988-3002, vol. 50, No. 12, IEEE.

Bax et al., "A GSM Modulator Using a $\Delta\Sigma$ Frequency Discriminator Based Synthesizer", IEEE Journal of Solid-State Circuits, Aug. 2001, pp. 1218-1227, vol. 36, No. 8, IEEE.

* cited by examiner

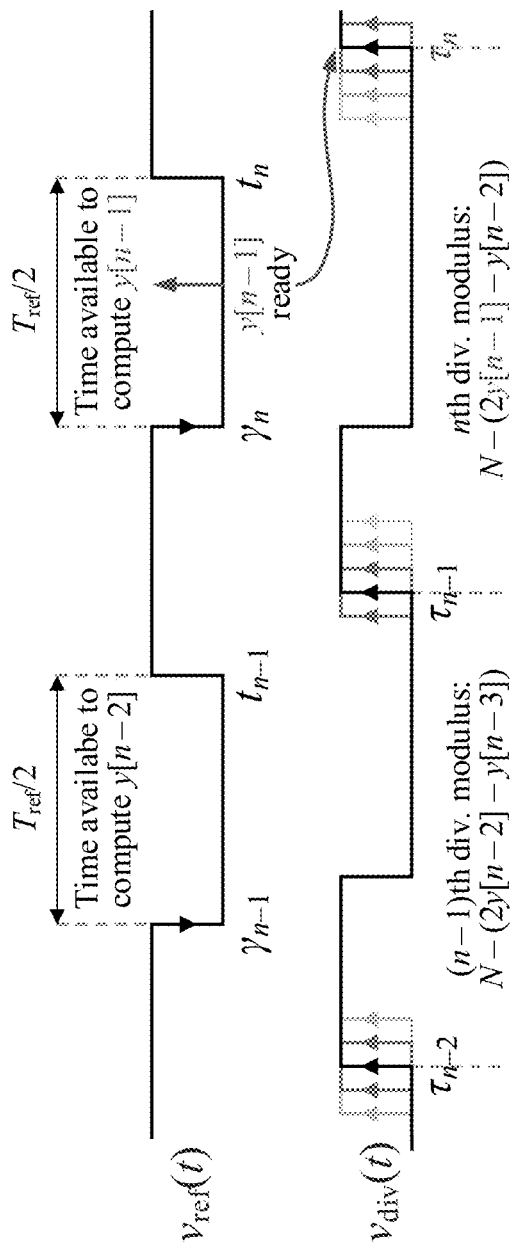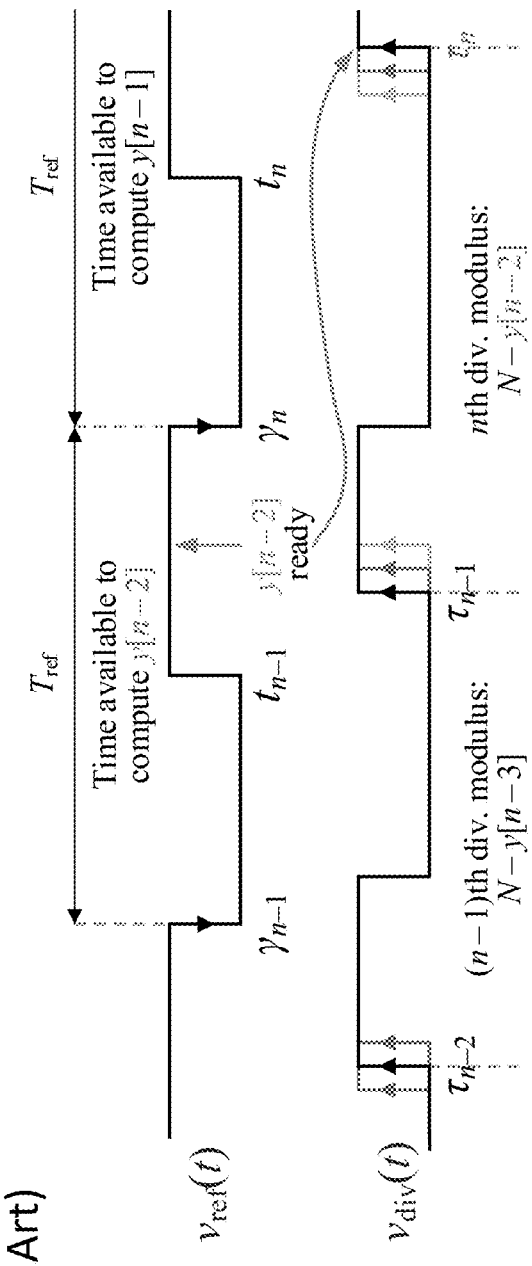
FIG. 4A
(Prior Art)
FIG. 4B

FREQUENCY TO DIGITAL CONVERTER, ASYNCHRONOUS PHASE SAMPLER AND DIGITALLY CONTROLLED OSCILLATOR METHODS

PRIORITY CLAIM AND REFERENCE TO RELATED APPLICATION

The application claims priority under 35 U.S.C. § 119 and all applicable statutes and treaties from prior provisional application Ser. No. 62/944,797, which was filed Dec. 6, 2019, and is incorporated by reference herein.

STATEMENT OF GOVERNMENT INTEREST

This invention was made with government support under 1617545 awarded by the National Science Foundation. The government has certain rights in the invention.

FIELD

A field of the invention is frequency synthesis. Example applications of the invention are in wired and wireless communications. A particular application of the invention is in wireless transceivers for the generation of radio frequency (RF) local oscillator signals used to up-convert and down-convert transmitted and received RF signals.

BACKGROUND

Evolving wireless communication standards place increasingly stringent performance requirements on the frequency synthesizers that generate RF local oscillator signals for up and down conversion in wireless transceivers. Conventional analog fractional-N PLLs with digital delta-sigma ($\Delta\Sigma$) modulation are the current standard for such frequency synthesizers because of their excellent noise and spurious tone performance. See, e.g., T. A. Riley, M. A. Copeland, T. A. Kwasniewski, "Delta-sigma modulation in fractional-N frequency synthesis," IEEE Journal of Solid-State Circuits, vol. 28, no. 5, pp. 553-559, May 1993. Unfortunately, they require high-performance analog charge pumps and large-area analog filters, so the trends of CMOS technology scaling and increasingly dense system-on-chip integration have created an inhospitable environment for them.

Digital fractional-N PLLs have been developed over the last decade to address this problem. See, e.g., C. Hsu, M. Z. Straayer, M. H. Perrott, "A Low-Noise, Wide-BW 3.6 GHz Digital $\Delta\Sigma$ Fractional-N Frequency Synthesizer with a Noise-Shaping Time-to-Digital Converter and Quantization Noise Cancellation," IEEE International Solid-State Circuits Conference, pp. 340-341, February 2008. They avoid large analog loop filters and can tolerate device leakage and low supply voltages which makes them better-suited to highly-scaled CMOS technology than analog PLLs. They are increasingly used in place of analog PLLs as frequency synthesizers, but they have yet to fully replace analog PLLs in high-performance wireless applications. While both analog and digital fractional-N PLLs introduce quantization noise, in prior digital PLLs the quantization noise has higher power or higher spurious tones than in comparable analog PLLs. Consequently, they exhibit worse phase noise or spurious tone performance than the best analog PLLs. See, e.g., K. Wang, A. Swaminathan, I. Galton, "Spurious-Tone Suppression Techniques Applied to a Wide-Bandwidth 2.4 GHz Fractional-N PLL," IEEE Journal of Solid-State Circuits, vol. 43, no. 12, pp. 2787-2797, December 2008.

Digital PLLs based on second-order $\Delta\Sigma$ frequency-to-digital conversion (FDC-PLLs) offer a potential solution to this problem in that their quantization noise ideally is equivalent to that of an analog PLL with second-order $\Delta\Sigma$ modulation. To the knowledge of the inventors, prior second-order FDC-PLLs incorporate charge pumps and ADCs. See, e.g., W. T. Bax, M. A. Copeland, "A GMSK Modulator Using a $\Delta\Sigma$ Frequency Discriminator-Based Synthesizer," IEEE Journal of Solid-State Circuits, vol. 36, no. 8, pp. 1218-1227, August 2001; C. Venerus, I. Galton, "Delta-Sigma FDC Based Fractional-N PLLs," IEEE Transactions on Circuits and Systems I: Regular Papers, vol. 60, no. 5, pp. 1274-1285, May 2013.

The state-of-the art has been previously advanced by the following FDC-PLL architectures. See, C. Weltin-Wu, G. Zhao, and I. Galton, "A Highly-Digital Frequency Synthesizer Using Ring-Oscillator Frequency-to-Digital Conversion and Noise Cancellation," IEEE Int. Solid-State Circuits Conf. (ISSCC) Dig. Tech. Papers, February 2015, pp. 1-3; C. Weltin-Wu, G. Zhao, and I. Galton, "A 3.5 GHz Digital Fractional-N PLL Frequency Synthesizer Based on Ring Oscillator Frequency-to-Digital Conversion," IEEE J. Solid-State Circuits, vol. 50, no. 12, pp. 2988-3002, December 2015; C. Weltin-Wu, E. Familier, and I. Galton, "A Linearized Model for the Design of Fractional-N Digital PLLs Based on Dual-Mode Ring Oscillator FDCs," IEEE Trans. Circuits Syst. I, Reg. Papers, vol. 62, no. 8, pp. 2013-2023, August 2015.

A high-level block diagram of a second-order $\Delta\Sigma$ FDC-based fractional-N PLL 100 consistent with the state-of-the-art in the previous paragraph is shown in FIG. 1. It consists of a $\Delta\Sigma$ FDC 102, a digital loop controller (DLC) 104 with quantization noise cancellation (QNC) via adder 107, a digital loop filter 108 and a digitally-controlled oscillator (DCO) 110. The signal $v_{ref}(t)$ is the output of a reference oscillator with frequency $f_{ref}$ and $v_{PLL}(t)$ is the PLL output waveform. Ideally, $v_{PLL}(t)$ is periodic with frequency $f_{PLL} = (N+\alpha)f_{ref}$, where N is a positive integer and $\alpha$ has a fractional value that can range from $-\frac{1}{2}$ to $\frac{1}{2}$. Specifically, $$y[n] = -\alpha - e_{PLL}[n] + \underbrace{e_q[n] - 2e_q[n-1] + e_q[n-2]}_{2^{nd}-\text{order shaped version of } e_q[n]}, \quad (1)$$

where $e_q[n]$ is the quantization error introduced by the $\Delta\Sigma$ FDC and $e_{PLL}[n]$ is a measure of the average frequency error of $v_{PLL}(t)$ over the nth reference period. The $\hat{e}_q[n]$ sequence is an estimate of $e_q[n]$. It is added via the second adder after passing through the $1-z^{-1}$ differentiator. It is used to partially cancel the contribution of $e_q[n]$ at the input of the digital loop filter (DLF) within the DLC. By cancelling the quantization error prior to the loop filter, QNC allows the PLL's bandwidth to be increased without significantly degrading the PLL's phase noise.

A simplified block diagram of the $\Delta\Sigma$ FDC from C. Weltin-Wu, E. Familier, and I. Galton, "A Linearized Model for the Design of Fractional-N Digital PLLs Based on Dual-Mode Ring Oscillator FDCs," IEEE Trans. Circuits Syst. I. Reg. Papers, vol. 62, no. 8, pp. 2013-2023, August 2015 is shown in FIG. 2A. It consists of a PFD (Phase Frequency Detector) with top output u(t), a multi-modulus divider with output $v_{div}(t)$, a DMRO (Dual-Mode Ring Oscillator), a digital ring phase calculator (RPC), and a $2-z^{-1}$ digital feedback block with output v[n] that controls the divider. Although not shown in FIG. 2A for simplicity, the RPC's accumulator clips to keep its output in the range −2≤r[n]<3. This reduces the PLL's worst-case locking time but has no effect on the PLL's locked behavior. The PFD and divider are identical to those in analog PLLs.

Each reference period, the signal encoded in the width of the u(t) pulse is accumulated by the DMRO. Then, the outputs of the DMRO, which represent a quantized version of its phase, are sampled and processed by the RPC to generate y[n] and $-\hat{e}_q[n]$.

The DMRO is implemented as a ring of $N_R$ nominally identical delay cells. Ideally, its instantaneous frequency is $f_{high}$ when u(t) is high and $f_{low}$ when u(t) is low, where $$A\frac{(f_{high} - f_{low})}{f_{PLL}} = 1, \quad (2)$$

and A is a design parameter.

Each reference period, the quantized DMRO phase, $p_R[n]$, is computed from the sampled DMRO output lines. As indicated in FIG. 2A, $p_R[n]$ is passed through a $1-z^{-1}$ block, and a positive constant, M, is subtracted from the result prior to the multiplication by A and accumulation. These operations yield r[n], which is a fixed-point measure of $-\alpha-e_{PLL}[n]$ in units of cycles per reference period. The three most significant bits (MSBs) of r[n] correspond to the integer part of r[n], whereas the remaining least significant bits (LSBs) correspond to the fractional part of r[n].

The operation of the divider is such that adjacent rising edges of $v_{div}(t)$ are separated by N−v[n] PLL output periods. Ideally, v[n] would be set to 2r[n]−r[n−1], but dividers can only count integer numbers of PLL output periods and r[n] contains both integer and fractional parts. Therefore, it is necessary to instead use just the integer part of r[n], i.e., y[n], so that v[n]=2y[n]−y[n−1] is integer-valued. Given that y[n] is a quantized version of r[n], the fractional part of r[n], i.e., $-\hat{e}_q[n]$, is the negative of the corresponding quantization error. The DLC uses $-\hat{e}_q[n]$ to perform QNC.

The behavior of the system shown in FIG. 2A is identical to that of the second-order ΔΣ modulator shown in FIG. 3A. The phase quantization operation performed by the DMRO is denoted by $Q_r$ and modeled as a fine quantizer of step-size $\Delta_r=(2N_R)^{-1}$. Its quantization error, $e_{qr}[n]$, corresponds to the residual quantization error that is left after QNC. The quantization operation that occurs at the output of the RPC is denoted as $Q_c$ and modeled as a coarse quantizer with step-size $\Delta_c=1$. If $2N_R/A$ is integer-valued, then the blocks contained in the dashed contour in FIG. 3A are equivalent to an accumulator followed by a quantizer, Q, with unity step-size and associated error given by $$e_q[n] = Ae_{qr}[n] + \hat{e}_q[n]. \quad (3)$$

In this case, y[n] is given by (1) and the system's self-dithering property causes $e_q[n]$ to have a power spectral density (PSD) equivalent to that of a zero-mean white noise sequence with variance 1/12.

This ΔΣ FDC suffers from two issues. One issue is tight timing constraints on both the digital part of the ΔΣ FDC and the divider. The other issue is high sensitivity to non-ideal DMRO frequencies for higher PLL bandwidths. Once the ΔΣ FDC locks, the rising edges of $v_{div}(t)$ succeed and precede rising and falling edges of $v_{ref}(t)$, respectively. Therefore, as implied by FIG. 2A, after the nth rising edge of $v_{div}(t)$, the ΔΣ FDC must compute y[n] and use it along with y[n−1] to form v[n], which the divider then uses to determine the (n+1)th rising edge of $v_{div}(t)$. This limits the time available for the ΔΣ FDC to process the u(t) pulse and compute y[n] to approximately one reference period and requires a divider that is capable of loading the divider modulus in the middle or toward the end of the divider count. These features tend to increase the power consumption, circuit area, and complexity of the divider.

ΔΣ FDC-based PLLs are not highly sensitive to non-ideal values of $f_{high}$ and $f_{low}$, i.e., values of $f_{high}$ and $f_{low}$ that do not exactly satisfy (2), in much the same way that a second-order ΔΣ modulator is not sensitive, to deviations in the gain of its second accumulator. Nevertheless, the need to adjust the DMRO each time $f_{PLL}$ changes so that $f_{high}$ and $f_{low}$ at least approximately satisfy (2) complicates the DMRO design. Moreover, the accuracy with which (2) must be satisfied increases significantly with PLL bandwidth to the point that process, voltage, and temperature variations cause $f_{high}$ and $f_{low}$, to deviate from their ideal values enough to significantly degrade the PLL's phase noise.

Table of Abbreviations

The following list of abbreviations are used throughout this application:
ADC Analog to Digital Converter
CMOS Complementary Metal Oxide Semiconductor
CP Charge Pump
DC Direct Current
DCO Digitally Controlled Oscillator
DMRO Dual-Mode Ring Oscillator
ΔΣ Delta-Sigma
DLC Digital Loop Controller
DLF Digital Loop Filter
FCE Frequency Control Element
FDC Frequency to Digital Converter
FSM Finite State Machine
IFS Incremental Frequency Switching
IS-FSM Incremental-Switching Finite State Machine
ISL Incremental Switching Logic
LFCE Latched-Frequency Control Element
LUT Look-Up Table
MSB Most Significant Bit
PEDC Phase Error to Digital Converter
PFD Phase Frequency Detector
PLL Phase-Locked Loop
PSD Power Spectral Density
RF Radio Frequency
RO Ring Oscillator
RPC Ring Phase Calculator
QNC Quantization Noise Cancellation

SUMMARY OF THE INVENTION

A preferred embodiment is a delta-sigma frequency-to-digital converter. The converter includes a phase-frequency detector that receives a periodic reference signal. A dual-mode ring oscillator is driven by an output of the phase-frequency detector. A ring phase calculator samples outputs of the dual-mode ring oscillator to calculate phase of the dual-mode ring oscillator. Digital feedback is provided to an accumulator in the ring phase calculator that provides the converter output. Feedback of a delayed version of the converter output is provided through a divider to the phase-frequency detector.

The preferred converter or other converters can benefit from a preferred digital background correction method. A preferred technique can be implemented in the ring phase calculator. Preferably, the digital background calibration comprises a signed least-mean square (LMS)-like loop with gain K and output $g_n$, which digitally compensates for forward path gain error caused by $\delta \neq 1$ (forward gain in the absence of gain correction).

Another converter that can benefit from the digital background calibration is a charge pump-based converter. The converter includes a phase-frequency detector that receives a periodic reference signal. A charge pump that charges and discharges a capacitor. A one-shot circuit that prevents the magnitude of the charge pump output to grow without bound. An analog-to-digital converter is driven by an output of the charge pump. A multi-modulus divider provides feedback to the phase-frequency detector. Digital background calibration is provided by a multiplier at the output of the analog-to-digital converter to correct for deviations of charge pump currents and capacitance of capacitor from their ideal values.

Asynchronous phase sampling can also be implemented. A preferred ring oscillator delay-free asynchronous phase sampler samples outputs of the ring oscillator (RO). A cycle counter with two counters is clocked by the rising and falling edges, respectively, of the output of the RO. A phase decoder processes the outputs of the RO and selects a sampled counter output that was not changing when the sampling event occurred. Correction logic to compensate for arbitrary initial conditions of the RO and counters within the cycle counter.

A digitally-controlled oscillator (DCO) control technique of the invention is applicable to FDC-based PLLs discussed above but is widely applicable to other digital PLLs. The DCO control technique causes the DCO frequency to increase or decrease by changing the state of one its frequency control elements (FCEs) at a time includes a bank of FCEs to control the DCO frequency, the FCE bank having an array of latched-FCEs (LFCEs). A digital interface accepts an input codeword and outputs two control signals and their inverted versions to control the FCEs' bank. The array of LFCEs is connected to the control signals through an intra-network of switches, with each top switch being controlled by the state of the LFCE to its right (or an inverted version of it) and each bottom switch being controlled by the state of the LFCE to its left (or an inverted version of it). A DCO digital interface includes an incremental switching logic (ISL) and an incremental-switching finite-state-machine (IS-FSM). the ISL splits the input codeword into its integer and fractional parts, digitally re-quantizing the fractional part and adding it to the integer part of the input codeword, an output of this operation being passed through control logic including a clipper, an accumulator, a carry-generator and an adder, wherein the control logic outputs changes in its input (limited to ±1) and the carry is added to the next sample, to serialize a change in the control logic input. An output of the ISL is a signal that takes on values from $\{-1, 0, 1\}$ and is passed to the IS-FSM, wherein the IS-FSM generates two control signals and their inverted versions that control the array of LFCEs.

BRIEF DESCRIPTION OF THE DRAWINGS

The invention will be explained in greater detail hereinafter on the basis of exemplary embodiments illustrated in the drawings, in which:

FIG. 4A (Prior Art) shows example timing diagrams for the FIG. 2A ΔΣ FDC

FIG. 4B shows example timing diagrams for the present ΔΣ FDC of FIG. 2B;

DETAILED DESCRIPTION OF THE PREFERRED EMBODIMENTS

Preferred embodiments provide a ΔΣ FDCs that reduce implementation complexity and improve performance. The invention also provides a method for digital gain correction. A preferred digital background calibration method compensates for forward path gain error and eliminates the need to include analog gain correction in feedback.

A preferred ΔΣ FDC architecture has relaxed timing constraints and a 3× smaller phase-frequency detector (PFD) output pulse-width span compared to prior state-of-the art architectures discussed in the background. The preferred architecture is therefore simpler to implement and is amenable to higher-frequency reference signals for any given PLL output frequency, which is useful because increasing the reference frequency reduces the contributions of the reference signal phase noise, ΔΣ FDC quantization error, and DMRO phase noise to the PLL's output phase noise.

The DMRO in a DMRO-based ΔΣ FDC is designed to oscillate at one of two frequencies at any given time. These frequencies, denoted as $f_{high}$ and $f_{low}$, ideally have a specific relationship to the PLL output frequency, $f_{PLL}$. In prior art DMRO-based ΔΣ FDCs, $f_{high}$ and $f_{low}$ are adjusted each time $f_{PLL}$ is changed to approximate this ideal relationship, which adds complexity to the DMRO design. Furthermore, while the PLL's performance is relatively insensitive to deviations of $f_{high}$ and $f_{low}$ from their ideal values for low-to-moderate PLL bandwidths, this is not the case for high PLL bandwidths.

The invention includes a digital background calibration that addresses these issues. Rather than dynamically adjusting $f_{high}$ and $f_{low}$ by controlling the DMRO's analog circuitry as a function of $f_{PLL}$, it dynamically adjusts digital circuitry to compensate for error that would otherwise be caused by non-ideal values of $f_{high}$ and $f_{low}$. Moreover, it does so with much finer resolution than prior art ΔΣ FDCs are able to adjust the DMRO to tune $f_{high}$ and $f_{low}$. These benefits greatly simplify the DMRO, which can now be designed to have fixed values of $f_{high}$ and $f_{low}$, and significantly reduce phase noise for high PLL bandwidths.

Preferred embodiments of the invention will now be discussed with respect to the drawings. The drawings may include schematic representations, which will be understood by artisans in view of the general knowledge in the art and the description that follows.

Figure 2A:
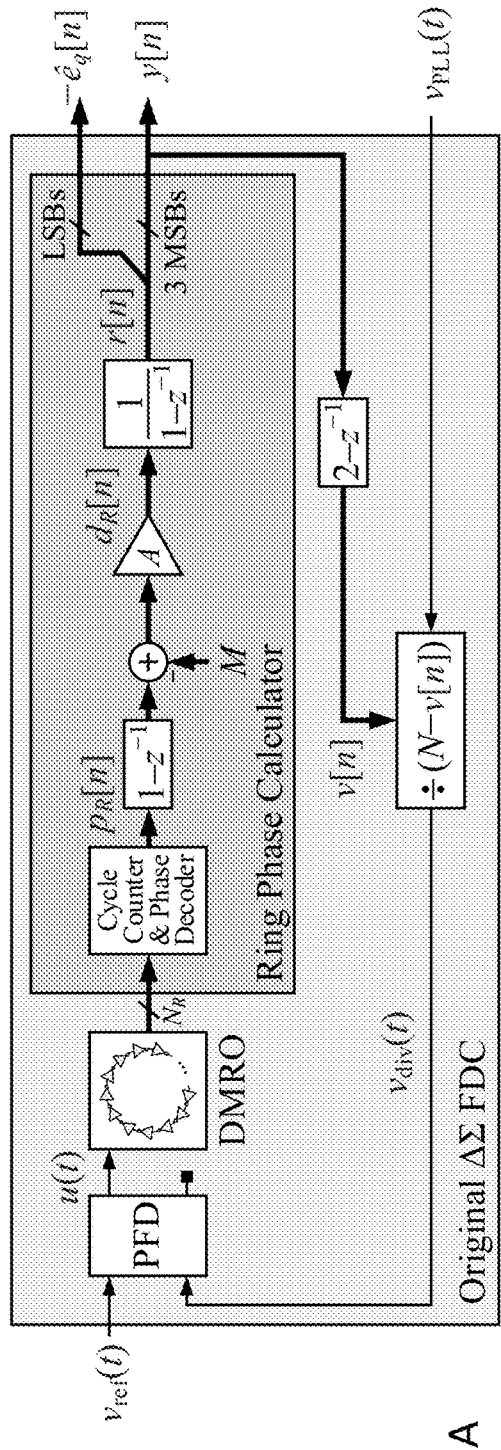
FIG. 2A (Prior Art) simplified block diagram of the DMRO-based ΔΣ FDC described in C. Weltin-Wu, E. Familier, and I. Galton, "A Linearized Model for the Design of Fractional-N Digital PLLs Based on Dual-Mode Ring Oscillator FDCs," *IEEE Trans. Circuits Syst. I. Reg. Papers*, vol. 62, no. 8, pp. 2013-2023, August 2015.
Figure 2B:
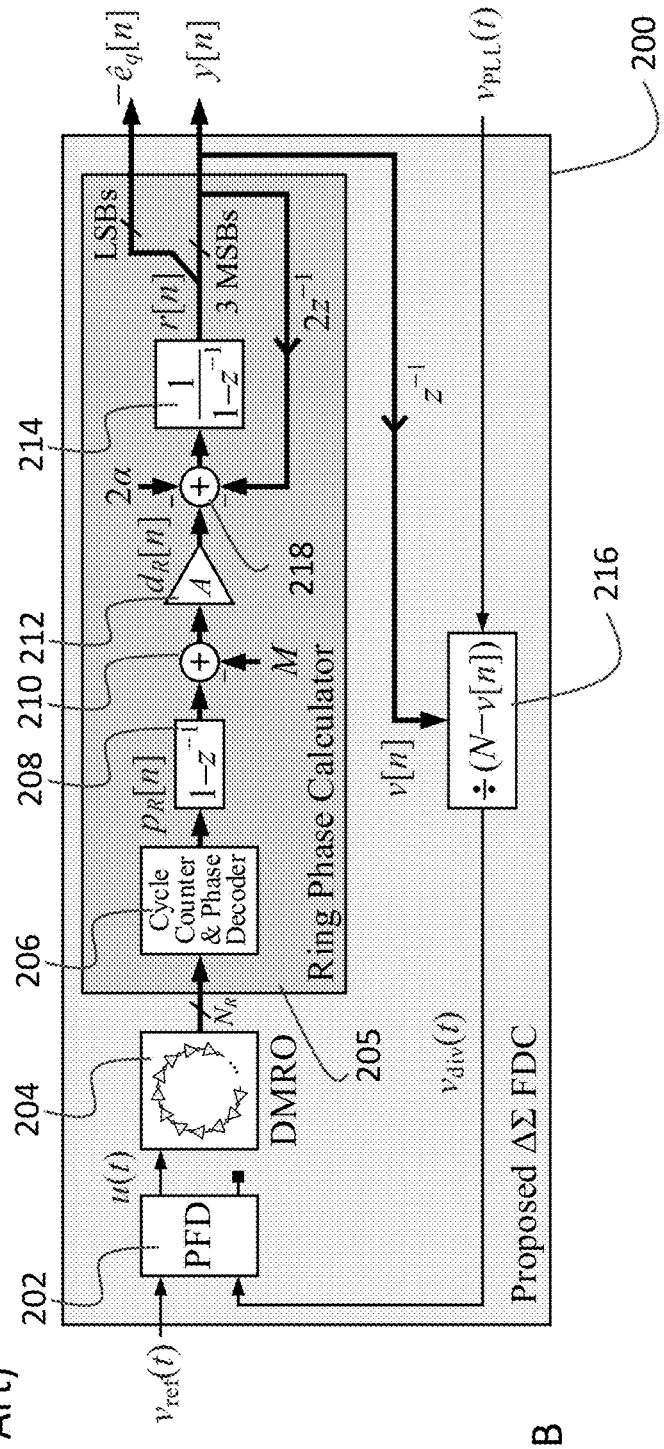
FIG. 2B is a simplified block diagram of the DMRO-based ΔΣ FDC according to the present invention.

A preferred embodiment ΔΣ FDC 200 is shown in FIG. 2B. The sequences v[n], $p_R[n]$ and $d_R[n]$ and the signals u(t) and $v_{div}(t)$ in FIG. 2B different from those in FIG. 2A but are labelled the same because the signal sequences play the same role in each. The input, $v_{ref}(t)$, to the ΔΣ FDC 200 is a periodic reference signal and is provided to a phase-frequency detector PFD 202. With each reference period, the quantized DMRO phase, $p_R[n]$, from a DMRO 204 is received by a ring phase calculator RPC 205 and is computed by its cycle counter and phase decoder 206 from the sampled DMRO output lines. As indicated in FIG. 2B, $p_R[n]$ representing the sampled and quantized DMRO phase is passed through a $1-z^{-1}$ differentiator 208, and a positive constant M, which represents the average number of cycles that the DMRO advances per reference period, is subtracted by M-adder 210 from the result prior to the multiplication 212 by A (design parameter chosen to nominally set total forward gain equal to 1) and accumulation by accumulator 214. Instead of feeding back the multi-modulus divider control sequence 2y[n]−y[n−1] through a divider 216 as in FIG. 2A, 2y[n−1] is fed back directly to the input of the accumulator 214 within the RPC 205 by a adder 218, and only a delayed version of the FDC output y[n−1] is fed back through the divider 216. The direct feedback to the accumulator 214 simplifies the architecture and improves performance.

Figure 3A:
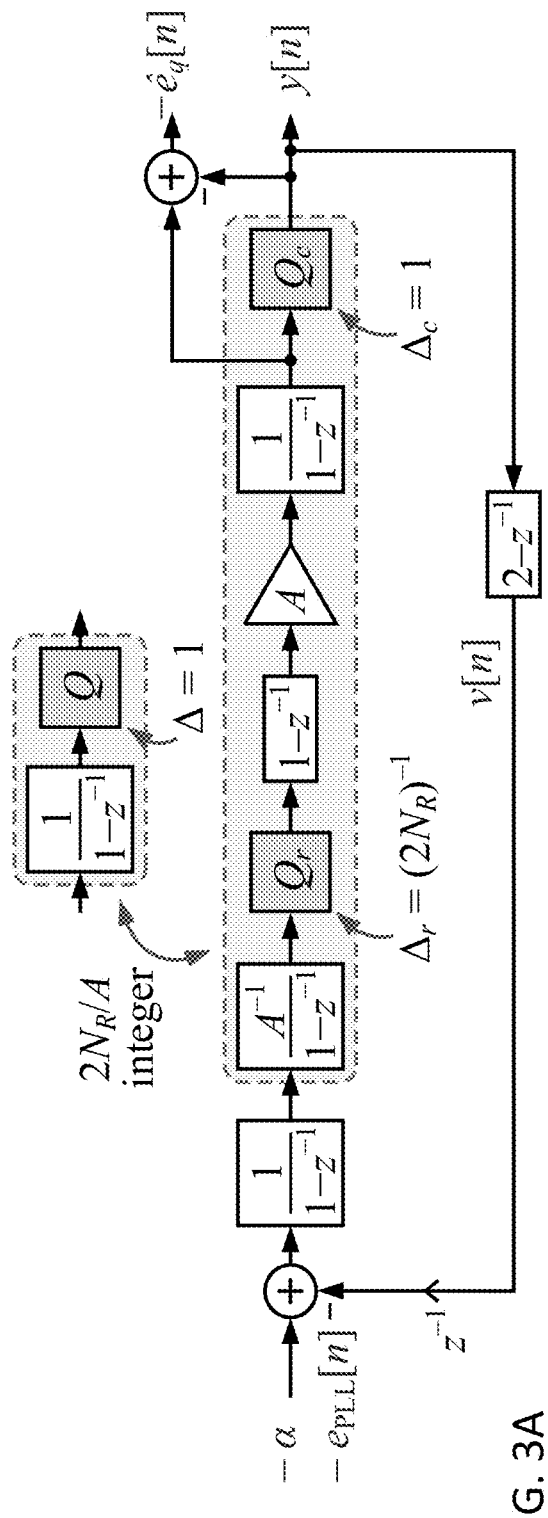
FIG. 3A (Prior Art) is a single processing equivalent of the FIG. 2A DMRO-based ΔΣ FDC.
Figure 3B:
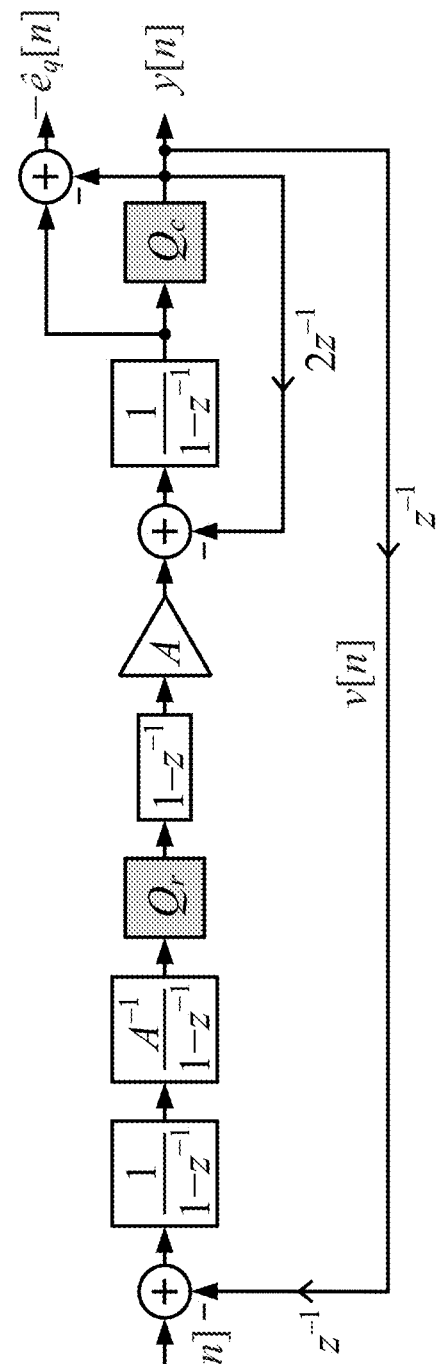
FIG. 3B is a single processing equivalent of the FIG. 2B DMRO-based ΔΣ FDC.

The ΔΣ FDC 200 is equivalent to the functional representation in FIG. 3B. That function is also identical to the function in FIG. 3A under the condition that $2N_R/A$ is integer-valued.

In the FIGS. 2A and 3A prior ΔΣ FDC, once it locks, the DMRO locks to an average frequency of $Mf_{ref}$, which minimizes the potential for fractional spurs if M is integer-valued. Specifically, given that r[n] is bounded when the ΔΣ FDC is locked, the input to the accumulator within the RPC, and, hence, the M-adder output, must be zero-mean, which can only happen if the DMRO phase advances, on average, M cycles per reference period.

In the ΔΣ FDC 200, the average of the M-adder 210 output is forced to zero by subtracting a constant 2α from the input of the accumulator 214, which forces average DMRO frequency to be given by $Mf_{ref}$. Reasoning and (1) imply that without the 2α subtraction at adder 218, the local feedback around the accumulator 214 would cause the output of the M-adder to have an average of $-2A^{-1}α$. In this case, the DMRO would lock to $(M-2A^{-1}α)f_{ref}$, which would increase the potential for fractional spurs.

The 2α subtraction slightly increases the PLL's digital complexity relative to a comparable PLL based on FIG. 2A. For instance, in the PLL implementation simulated, the cycle counter and phase decoder's output, $p_R[n]$, has 10 fractional bits, α has 20 fractional bits, and A=1, so the 2α subtraction nearly doubles the number of fractional bits required to represent the RPC accumulator's input. Nonetheless, the number of fractional bits in the DLF input is determined by a regardless of which ΔΣ FDC is used, so the 2α subtraction in the ΔΣ FDC 200 only affects the RPC's accumulator 214. Hence, it represents only a minor increase in the PLLs overall digital complexity. Moreover, this increase in complexity can be offset by additional features described below. When the ΔΣ FDC 200 is used in a PLL, an output span of the phase-frequency detector 202 can advantageously be smaller than twice the period of PLL output.

It follows from FIG. 3B that for the ΔΣ FDC 200 the discrete-time transfer function from the input to the second accumulator output has a pole at DC, which suggests that the system is unstable. Although the 2α term injected within the RPC 205 causes the DC component at the output of the second accumulator to be zero, noise present at this node can cause the magnitude of the accumulator output to grow without bound. However, the second accumulation shown in FIG. 3B is performed by the DMRO 204, so this is not an issue in practice because the DMRO 204 behaves as an accumulator with infinite output range. Specifically, provided the cycle counter 206 within the RPC 205 does not roll-over more than once per reference period, which can be ensured by design, then the $1-z^{-1}$ differentiator 208 within the RPC 205 can unwrap the sampled DMRO phase and retrieve the information encoded in it, thereby allowing the magnitude of the second accumulator's output in FIG. 3B to be arbitrarily large.

Features to offset additional complexity include relaxed timing constraints. FIG. 4A shows example timing diagrams for the FIG. 2A ΔΣ FDCs and FIG. 4B for the present ΔΣ FDC 200 of FIG. 2B, where the time sequences $t_n$ and $τ_n$, for n=0, 1, 2, . . . , are the times of the nth rising edges of $v_{ref}(t)$ and $v_{div}(t)$, respectively, and the nth divider modulus is the number of PLL output periods between $τ_{n-1}$ and $τ_n$. In this example, the DMRO phase is sampled at times $γ_R = t_{n-1} + T_{ref}/2$, where $T_{ref}=1/f_{ref}$ is the reference period, and the nth divider modulus can be loaded at time $t_n$ at the latest.

In the FIG. 2A ΔΣ FDC, the nth divider modulus is given by N−(2y[n−1]−y[n−2]), but as illustrated in FIG. 4A, y[n−1] cannot be computed before the DMRO phase is sampled at $γ_n > τ_{n-1}$. It follows that the nth divider modulus can only be loaded once y[n−1] is ready around the middle or near the end of the count, which increases the divider's complexity. Furthermore, as the divider modulus must be updated before $t_n$, the amount of time available for the ΔΣ FDC to compute y[n−1] is limited to $T_{ref}/2$.

As illustrated in FIG. 4B, the present ΔΣ FDC 200 has much more relaxed timing constraints. In this case, the nth divider modulus is given by N−y[n−2]. By the time of the (n−1)th rising edge of $v_{div}(t)$, the ΔΣ FDC 200 has already had a duration of more than $T_{ref}/2$ to compute y[n−2], so the next count can start with a known divider modulus. Alternatively, the computation of y[n−2] can take up to $T_{ref}$ and the divider modulus can be updated near the beginning of the current count. In either case, compared to the FIG. 2A ΔΣ

FDC, the present ΔΣ FDC allows for simpler divider topologies to be used and imposes looser digital timing constraints on the ΔΣ FDC.

Another feature is reduced PFD output span. For the FIG. 2A ΔΣ FDC, $e_{PLL}[n]$ in (1) is given by $$e_{PLL}[n]\psi_{PLL}[n]-(N+\alpha)\psi_{ref}[n]-A(\psi_{DMRO}[n]-\psi_{DMRO}[n-1]), \quad (4)$$

the $e_q[n]$ sequence is bounded by $$-1 < e_q[n] \leq 0, \quad (5)$$

and the width of u(t) is given by $$\tau_n-t_n=T_u^-+(-y[n-1]-\psi_{PLL}[n]+(N+\alpha)\psi_{ref}[n]-\Delta\psi_{DMRO}[n-1]-e_q[n-1]+e_q[n-2]-\alpha)T_{PLL}, \quad (6)$$

where $\psi_{PLL}[n]$, $\psi_{ref}[n]$ and $\psi_{DMRO}[n]$ are the phase noise changes per reference period of $v_{PLL}(t)$, $v_{ref}(t)$ and the DMRO, respectively, and $$T_u = \frac{M - T_{ref}f_{low}}{f_{high} - f_{low}} \quad (7)$$

is the average width of the u(t) pulse.

Suppose $b_{PLL}$ and $b_{DMRO}$ are the maximum magnitudes of $e_{PLL}[n]$ and $\psi_{DMRO}[n]$, respectively, so $$|e_{PLL}[n]|<b_{PLL} \text{ and } |\psi_{DMRO}[n]|<b_{DMRO} \quad (8)$$

for all n. Then, it follows from (1), (4)-(6) and (8) that the maximum span of u(t), $\Delta T_u$, which is defined as $$\Delta T_u = 2\max_n |\tau_n - t_n - T_u|, \quad (9)$$

satisfies $$\Delta T_u < 2(3+2b_{PLL}+Ab_{DMRO})T_{PLL}. \quad (10)$$

Analysis of the present ΔΣ FDC 200 yields (4), (5), and the following expression for the width of the u(t) pulse during the nth reference period:

$$\tau_n-t_n=T_u^-+(y[n-1]-\psi_{PLL}[n]+(N+\alpha)\psi_{ref}[n]-\Delta\psi_{DMRO}[n-1]-e_q[n-1]+e_q[n-2]+\alpha)T_{PLL}, \quad (11)$$

where $T_u^-$ is also given by (7). Hence, (1), (4), (5), (8), (9) and (11) imply that, for the present ΔΣ FDC 200, $\Delta T_u$ satisfies $$\Delta T_u < 2(1+2b_{PLL}+Ab_{DMRO})T_{PLL}. \quad (12)$$

In practice, $b_{PLL}$, $b_{DMRO} \ll 1$, so (10) and (12) imply that $\Delta T_u$ for the present ΔΣ FDC 200 is approximately a third of that of the prior FIG. 2A ΔΣ FDC.

A smaller $\Delta T_u$ allows for a larger minimum difference between the phases of $v_{ref}(t)$ and $v_{div}(t)$, so it is beneficial as it mitigates spurs generated as a consequence of variations in supply voltage of the PFD 202 when $v_{ref}(t)$ and $v_{div}(t)$ are close in phase. Additionally, reducing $\Delta T_u$ mitigates spurs from non-ideal DMRO behavior by increasing the time available for the DMRO 204's instantaneous frequency error transients to die out each reference period.

Figure 1:
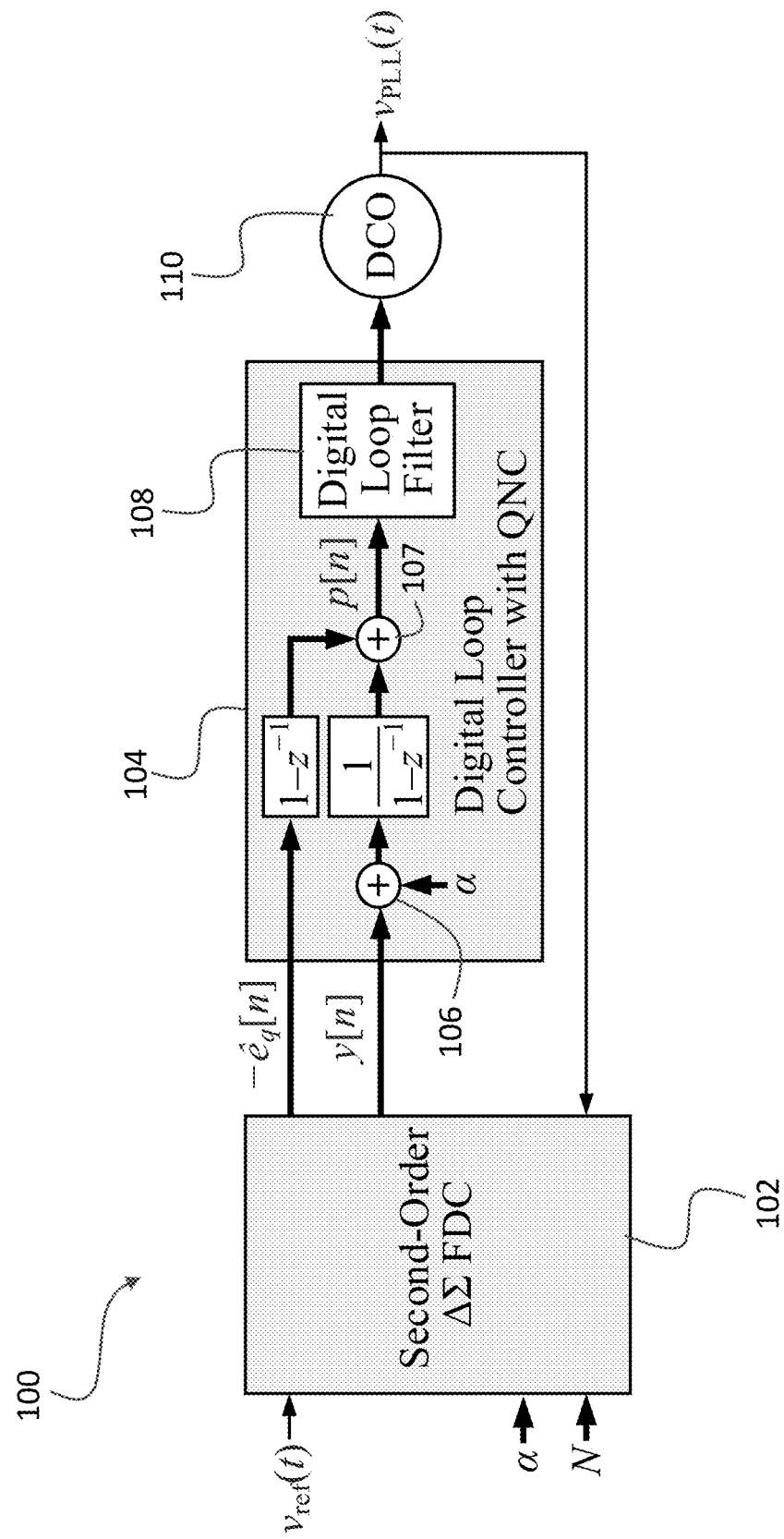
FIG. 1 (Prior Art) is a high-level block diagram of a second-order ΔΣ FDC-based digital fractional-N PLL with quantization noise cancellation (QNC)

Another feature is the ability to handle higher-frequency reference signals. The relaxed timing constraints and smaller $\Delta T_u$ of the present ΔΣ FDC 200 allows for the use of higher-frequency reference signals, which lowers the contribution to the PLL's phase noise from all noise sources within the ΔΣ FDC. As in conventional fractional-N PLLs, the contribution of the reference signal to the PLL output phase noise PSD, $S_{PLL}(f)$, is proportional to $(N+\alpha)^2$. Equations (1), (4) and FIG. 1 imply that the ΔΣ FDC quantization error and the DMRO phase noise appear first-order shaped at the DLF input (p[n] in FIG. 1), so their contribution to $S_{PLL}(f)$ is proportional to $\sin^2(\pi T_{ref}f)$. Additionally, the PSD of the quantization error is proportional to $T_{ref}$. Therefore, increasing $f_{ref}$ by a factor of x for a given $f_{PLL}$ with all other things being the same reduces the contributions to the PLL's phase noise from the reference signal, ΔΣ FDC quantization error, and DMRO by 20 log(x), 30 log(x) and 20 log(x), respectively.

Figure 6:
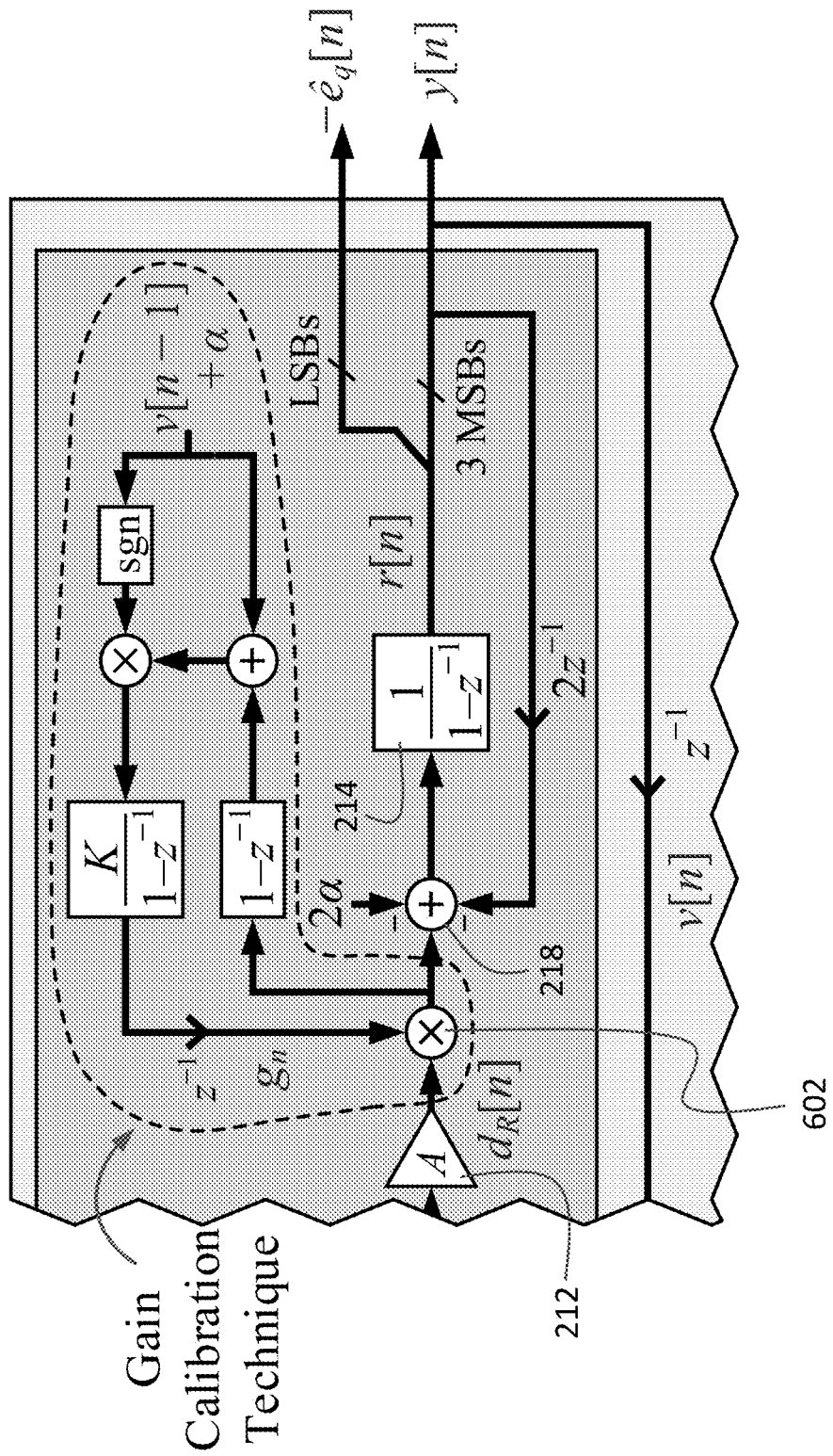
FIG. 6 shows a portion of the ring phase calculator of present ΔΣ FDC of FIG. 2B with application of a preferred digital gain correction method.

Digital Gain Calibration Method (FIG. 6).

As explained above, the behavior of the present ΔΣ FDC is identical to that of a second-order ΔΣ modulator provided (2) holds and $2N_R/A$ is integer-valued. However, in practice $$A\frac{f_{high}-f_{low}}{f_{PLL}} = \delta^{-1}, \quad (13)$$

where the deviation of the factor 8 from its ideal value of 1 is the ΔΣ FDC's forward path gain error. This error degrades the system's self-dithering property and, as shown below, it reduces the extent to which QNC cancels the error introduced by the ΔΣ FDC's coarse quantization operation.

Analysis presented in [C. Weltin-Wu, E. Familier, and I. Galton, "A Linearized Model for the Design of Fractional-N Digital PLLs Based on Dual-Mode Ring Oscillator FDCs," IEEE Trans. Circuits Syst. I. Reg. Papers, vol. 62, no. 8, pp. 2013-2023, August 2015] can be modified with (13) instead of (2) for the present ΔΣ FDC, 200 which yields the behavioral model of the ΔΣ FDC shown in FIG. 5A. The model is similar to that shown in FIG. 3B, except that $e_{PLL}[n]$ is given by (4) with δA instead of A, and the gain of the second accumulator is $(\delta A)^{-1}$ instead of $A^{-1}$. An analysis also be performed to obtain a linearized model of the ΔΣ FDC PLL shown in FIG. 1 with the present ΔΣ FDC 200 and (13) instead of (2). The resulting model is shown in FIG. 5B, where $\theta_{ref}(t)$, $\theta_{DMRO}(t)$, $\theta_{DCO}(t)$ and $\theta_{PLL}(t)$ are the phase error waveforms of the reference signal, DMRO, DCO and PLL output, respectively, L(z) is the DLF's transfer function, $K_{DCO}$ is the DCO gain (i.e., the amount in Hz by which the DCO frequency changes when the DCO input changes by unity) and $$H(z)=(1-\delta^{-1})z^{-2}. \quad (14)$$

Figure 5A:
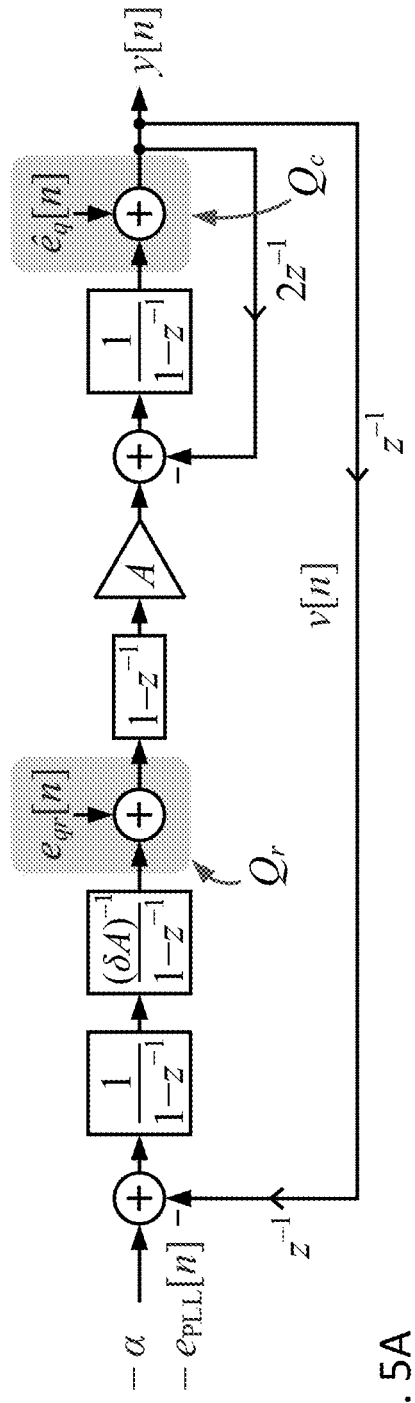
FIG. 5A is a behavioral model of the present ΔΣ FDC of FIG. 2B.
Figure 5B:
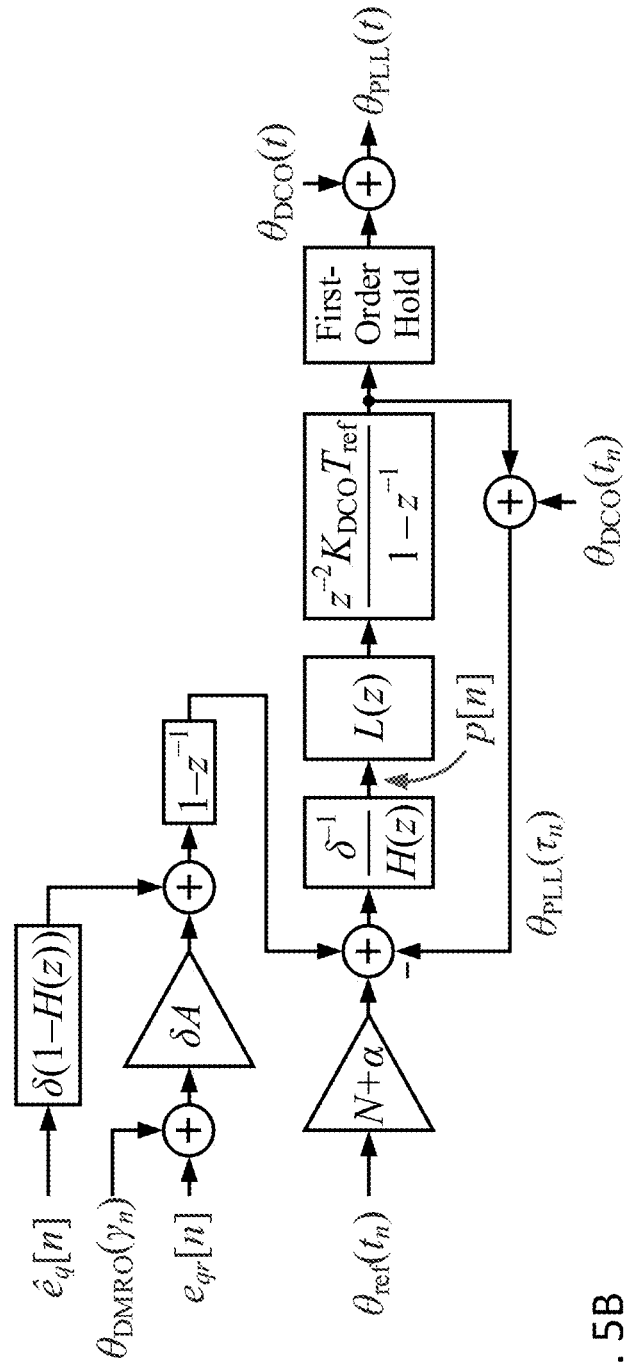
FIG. 5B is a behavioral model of the FIG. 1 PLL with the present ΔΣ FDC of FIG. 2B.

It follows from FIG. 5B that the discrete-time transfer functions from $e_{qr}[n]$ and $\hat{e}_q[n]$ to the input of the DLF, p[n], are given by $$A\frac{(1-z^{-1})}{H(z)}\frac{1}{1+T(z)} \text{ and } (1-\delta^{-1})z^{-2}\frac{(1-z^{-1})}{H(z)}\frac{1}{1+T(z)}, \quad (15)$$

respectively, where $$T(z) = \delta^{-1}K_{DCO}T_{ref}\frac{z^{-2}L(z)}{(1-z^{-1})H(z)} \quad (16)$$

is the discrete-time loop gain of the PLL. The right-most expression in (15) implies that if δ=1, then p[n] does not depend on $\hat{e}_q[n]$, but if δ≠1, then $\hat{e}_q[n]$ leaks into the DLF input. As the power of $\hat{e}_q[n]$ is much larger than that of $e_{qr}[n]$ in practice, this can be problematic, particularly for high PLL bandwidths. For instance, in the DMRO-based PLL presented in C. Weltin-Wu, G. Zhao, and I. Galton, "A 3.5 GHz Digital Fractional-N PLL Frequency Synthesizer Based on Ring Oscillator Frequency-to-Digital Conversion," *IEEE J. Solid-State Circuits*, vol. 50, no. 12, pp. 2988-3002, December 2015, A=1 and $N_R$=13, so $\Delta_r$=1/26 and the power of $\hat{e}_q[n]$ is approximately 28 dB larger than that of $e_{qr}[n]$ (recall that $\Delta_c$=1). In this case, (15) with A=1 implies that a $\Delta\Sigma$ FDC forward path gain error corresponding to $\delta^{-1}$=1±0.08 would introduce an additional error component that depends on $\hat{e}_q[n]$ with approximately double the power of the component that depends on $e_{qr}[n]$. This would significantly increase the PLL output phase noise PSD at offset frequencies where the $\Delta\Sigma$ FDC quantization error contribution dominates those of the other noise sources.

A digital gain calibration method of the invention can address these issues. The present digital gain calibration method modifies the $\Delta\Sigma$ FDC's RPC 206, the details of which are shown in FIG. 6, where sgn(x)=1 if x≥0 and −1 otherwise. To minimize clutter, FIG. 6 only shows a portion of the RPC 206.

The gain calibration technique consists of a signed least-mean square (LMS)-like loop with gain K and output $g_n$, which digitally compensates for forward path gain error caused by $\delta \neq 1$. It is based on the following two results. The first result is that $d_R[n]$ in FIG. 2B can be multiplied in a multiplier 602 by a constant factor $g_n$ to compensate for non-ideal DMRO frequencies. In the presence of this factor, the transfer function from $\hat{e}_q[n]$ to p[n] is given by $$(1 - g_n\delta^{-1})z^{-2}\frac{(1-z^{-1})}{H_g(z)}\frac{1}{1+T_g(z)}, \quad (17)$$

where $H_g(z)$ is given by (14) with $\delta^{-1}$ replaced by $g_n\delta^{-1}$ and $T_g(z)$ is given by (16) with $H_g(z)$ and $g_n\delta^{-1}$ instead of H(z) and $\delta^{-1}$, respectively. It follows from (17) that $g_n$=$\delta$ makes the contribution to p[n] from $\hat{e}_q[n]$ equal to zero. The second result is that $g_n(d_R[n]-d_R[n-1])$ equals $-v[n-1]-\alpha$ plus zero-mean error when $g_n$ is equal to its ideal value of $\delta$, i.e., $\delta(d_R[n]-d_R[n-1])$=$-v[n-1]-\alpha$ plus zero-mean error.

These observations suggest that, provided it is stable, the gain calibration feedback loop ramps $g_n$ up or down until it reaches the point where the input to the accumulator with gain K is zero-mean noise. FIG. 6 implies that this happens when $g_n(d_R[n]-d_R[n-1])+v[n-1]+\alpha$ is uncorrelated with $v[n-1]+\alpha$. Therefore, to the extent that the error component in $\delta(d_R[n]-d_R[n-1])$ is uncorrelated with $v[n-1]+\alpha$, the system converges to the ideal value of $g_n$=$\delta$.

In addition to preventing $\hat{e}_q[n]$ from leaking into the PLL loop, the proposed calibration technique also allows for the use of DMRO topologies with coarse frequency tuning or no tuning at all. This not only simplifies the design and implementation of the DMRO, but also simplifies the system as it renders feedback loops that tune $f_{high}$ and $f_{low}$ as a function of $f_{PLL}$ unnecessary.

The present calibration technique somewhat increases the digital complexity of the $\Delta\Sigma$ FDC 200, but typically does not add significantly to the PLL's overall power or area consumption. For example, in the PLL implementation described below, both $d_R[n]$ and $g_n$ have 10 fractional bits, so 20 fractional bits are required to represent $g_n d_R[n]$. Given that a also has 20 fractional bits, the gain calibration technique negligibly increases the number of fractional bits required to represent the RPC accumulator's input. Therefore, as the calibration technique's digital LMS loop is relatively simple, the $f_{ref}$-rate digital multiplier prior to the RPC's accumulator represents most of the calibration technique's added complexity.

Figure 7:
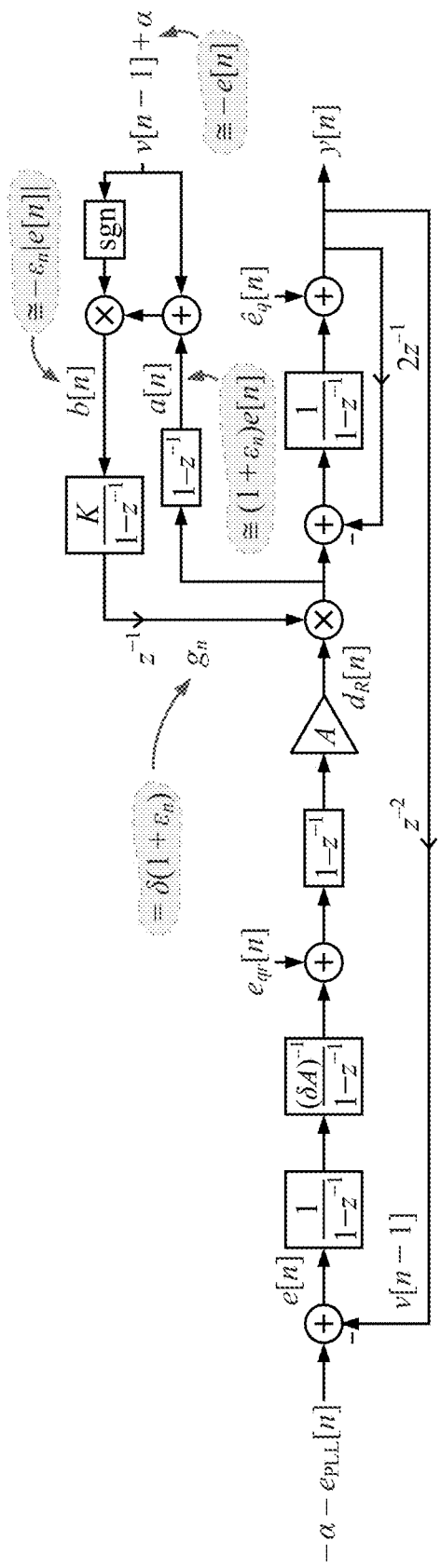
FIG. 7 is the behavioral model of FIG. 5A with the addition of the FIG. 6 digital gain correction method.

A convergences analysis shows the digital calibration causes $g_n$ to converge to its ideal value. FIG. 7 shows the block diagram of FIG. 5A modified to include the gain calibration technique of FIG. 6, where $\varepsilon_n$ is the error in $g_n$ at sample time n, which is defined as $$\varepsilon_n = \delta^{-1}g_n - 1. \quad (18)$$

For any fixed value of $g_n$ and neglecting $e_{qr}[n]$, FIG. 7 implies that a[n] is equal to $(1+\varepsilon_n)e[n]$, because the two $1-z^{-1}$ blocks cancel the two accumulators in the path between e[n] and a[n]. The gain calibration loop adds $v[n-1]+\alpha$, which is an estimate of $-e[n]$, to a[n], and multiplies the result by the sign of $v[n-1]+\alpha$ to obtain a measure of $\varepsilon_n$, b[n], which is approximately equal to $-\varepsilon_n|e[n]|$.

More precisely, FIG. 7 and (18) imply that e[n] is given by $$e[n] = -v[n-1]-\alpha-e_{PLL}[n], \quad (19)$$

and that a[n] can be written as $$a[n] = (1+\varepsilon_n)e[n] + (\varepsilon_n - \varepsilon_{n-1})\sum_{i=0}^{n-1}e[i] + a_e[n], \quad (20)$$

where $a_e[n]$ is the contribution of $e_{qr}[n]$ to a[n]. Substituting (19) into (20) adding $v[n-1]+a$ to the result, and then multiplying the resulting expression by $\text{sgn}(v[n-1]+\alpha)$ yields $$b[n] = -\varepsilon_n|v[n-1]+\alpha|+b_e[n], \quad (21)$$

where $b_e[n]$ is error that arises from the error in the estimate of e[n], the contribution of $e_{qr}[n]$, and $g_n$ not being constant.

FIG. 7 together with (18) and (21) further imply that $$\varepsilon_{n-1} = (1-\delta^{-1}K|v[n-1]+\alpha|)\varepsilon_n + \delta^{-1}Kb_e[n], \quad (22)$$

from which it follows that $$\bar{\varepsilon}_{n+1} = (1-\delta^{-1}K|v[n-1]+\alpha|)\bar{\varepsilon}_n + \delta^{-1}K\bar{b}_e[n], \quad (23)$$

where $\bar{\varepsilon}_n$ and $\bar{b}_e[n]$ are the expected values of $\varepsilon_n$ and $b_e[n]$, respectively, conditioned to the sequence $v[n-1]$.

When $\delta \neq 1$, the self-dithering property of the $\Delta\Sigma$ FDC is not perfect, so $e_{qr}[n]$ can be correlated with $\text{sgn}(v[n-1]+\alpha)$. Furthermore, it follows from FIG. 1 that:

$$p[n] = -e_q[n] + e_q[n-1] + \sum_{i=0}^{n}y[i] + \alpha \quad (24)$$

so FIG. 5B and $v[n-1]=y[n-2]$ imply that the term $\psi_{PLL}[n]=\theta_{PLL}(\tau_n)-\theta_{PLL}(\tau_{n-1})$ in $e_{PLL}[n]$, which depends on a low-pass filtered version of p[n], can also be correlated with $\text{sgn}(v[n-1]+\alpha)$. As $b_e[n]$ depends on both $e_{qr}[n]$ and $e_{PLL}[n]$, it follows from these observations that $\bar{b}_e[n]$ in (23) is not zero, so $b_e[n]$ biases the LMS loop (see FIGS. 6 and 7) and causes $g_n$ to converge to a value that is slightly different than J. However, numerous simulations suggest that the magnitude of this bias is sufficiently small that $\bar{b}_e[n]$ can be neglected in the remainder of the analysis. Hence, (23) reduces to $$\bar{\varepsilon}_{n+1} = (1-\delta^{-1}K|v[n-1]+\alpha|)\bar{\varepsilon}_n. \quad (25)$$

The recursive application of (25) to itself yields $$\varepsilon_{n+1} = \prod_{i=0}^{n}(1 - \delta^{-1}K|v[i-1] + \alpha|)\varepsilon_0, \quad (26)$$

which implies that, on average, $\varepsilon_{n+1}$ tends to zero provided K is chosen such that $$\lim_{n\to\infty}\prod_{i=0}^{n}(1 - \delta^{-1}K|v[i-1] + \alpha|) = 0. \quad (27)$$

As $v[n-1]+\alpha$ is bounded and is regularly non-zero, (27) is easy to satisfy in practice.

Figure 8A:
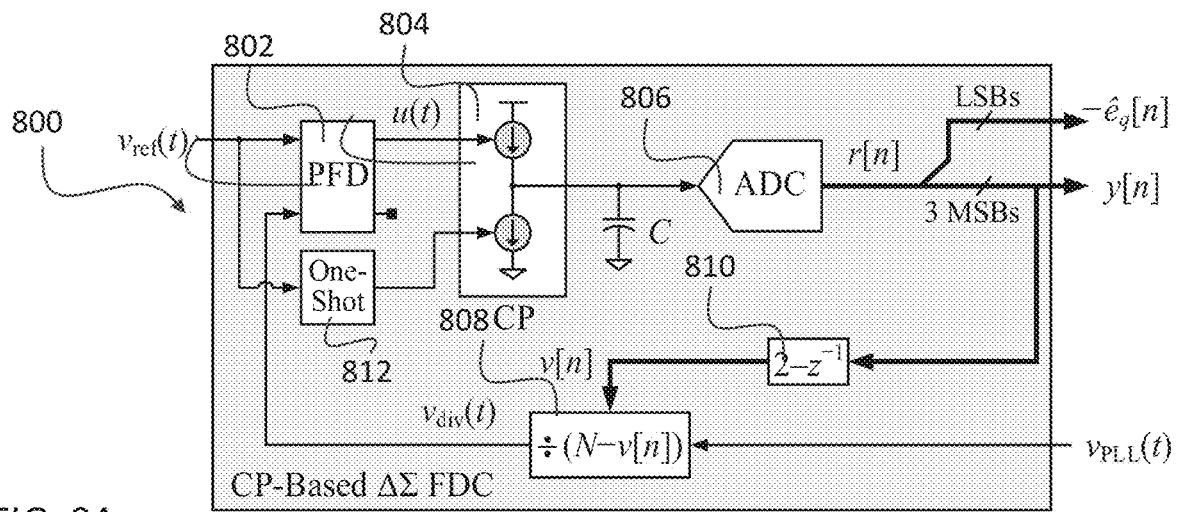
FIG. 8A (Prior Art) shows a charge pump based ΔΣ FDC.

FIG. 8A shows a charge pump (CP)-based $\Delta\Sigma$ FDC 800. It consists of a phase-frequency detector (PFD) 802 with output u(t), a charge pump (CP) 804 that charges and discharges the capacitor C, an analog-to-digital converter (ADC) 806 driven by an output of the CP 804, a multi-modulus divider 808 with output $v_{div}(t)$, and a $2-z^{-1}$ digital feedback circuitry 810 with output v[n]. It also comprises a One-shot circuit 812 that prevents the magnitude of the CP output to grow without bound. The PFD 802 and divider 808 are identical to those in analog PLLs.

Figure 8B:
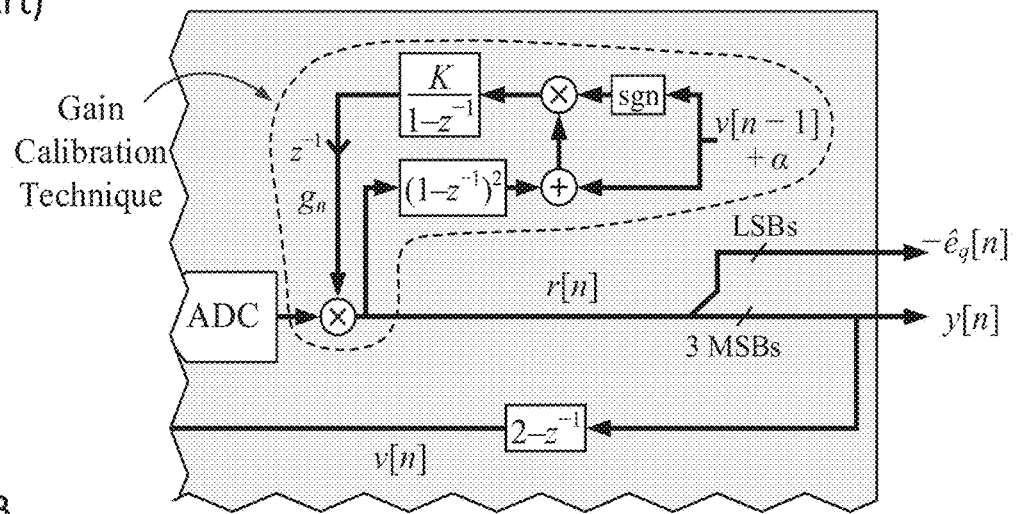
FIG. 8B shows a preferred digital gain correction method applied to the FIG. 8A charge pump based ΔΣ FDC.

The digital gain correction method of FIG. 6 is also applicable to a charge pump-based $\Delta\Sigma$ FDC. FIG. 8A shows a CP based $\Delta\Sigma$ FDC, and FIG. 8B the modified version with the digital gain correction of FIG. 6. The only one difference in FIG. 8B compared to FIG. 6 is an extra $1-z^{-1}$ differentiator. In the CP-based $\Delta\Sigma$ FDC, the CP and subsequent analog-to-digital converter (ADC) play the same role as the DMRO in the DMRO-based $\Delta\Sigma$ FDC. The DMRO-based $\Delta\Sigma$ FDC already has a $1-z^{-1}$ differentiator following the DMRO, which is needed as part of the circuitry that makes it possible to read out the DMRO's phase error, but this differentiator is not necessary in the CP-based $\Delta\Sigma$ FDC. The additional $1-z^{-1}$ differentiator in FIG. 8B compensates for the absence of a $1-z^{-1}$ differentiator at the output of the ADC in the CP-based $\Delta\Sigma$ FDC architecture.

Delay-Free Asynchronous Phase Sampling.

Figure 9:
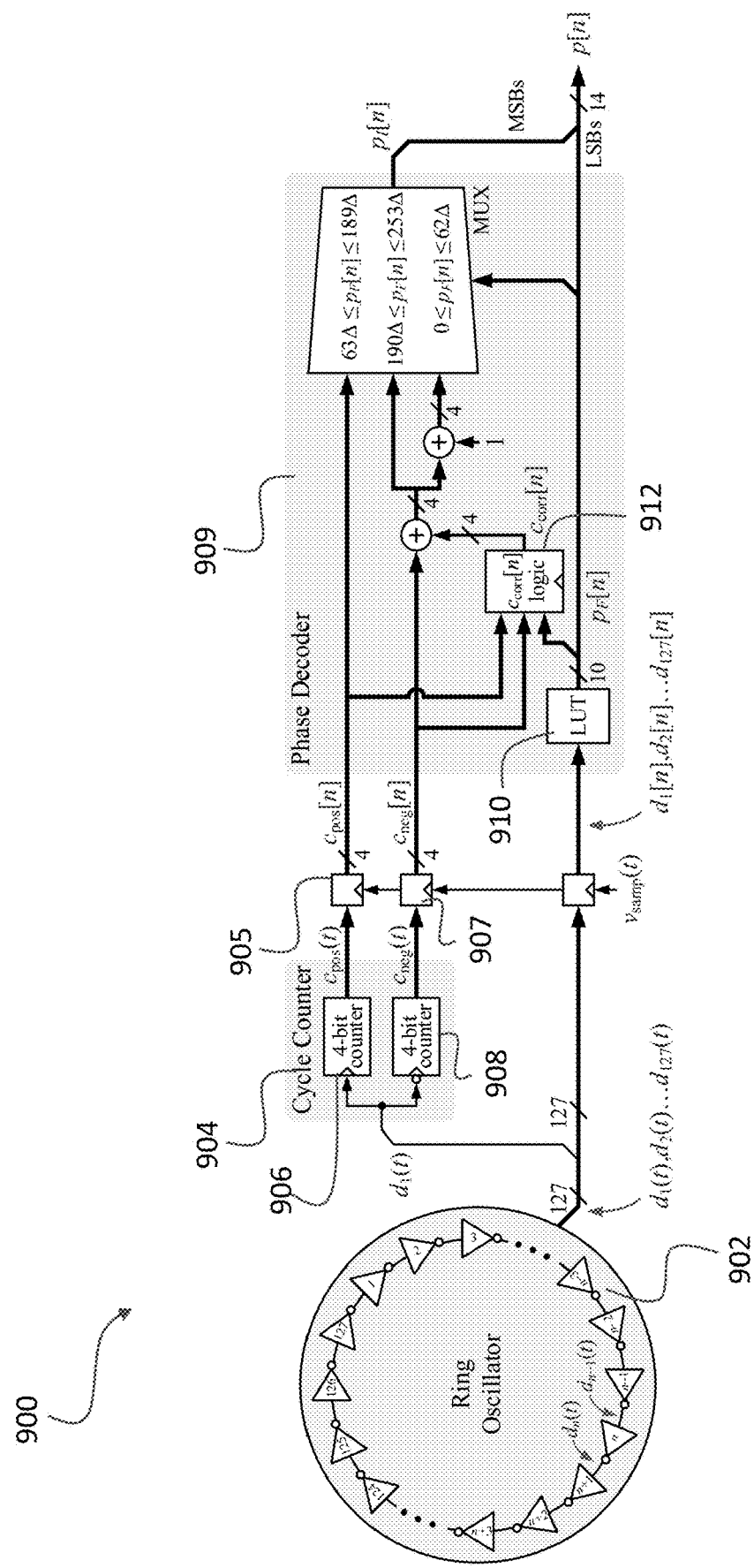
FIG. 9 shows a preferred delay-free asynchronous phase sampling for the FIG. 2B DMRO or any system where the phase of a ring oscillator (RO) needs to be sampled with a clock signal asynchronous to the RO's frequency.

The invention also provides for delay-free asynchronous phase sampling of the DMRO 204 in FIG. 2B or more generally, any system where the phase of a ring oscillator (RO) needs to be sampled with a clock signal asynchronous to the RO's frequency. FIG. 9 shows a preferred embodiment delay-free asynchronous phase sampling method 900 to sample a RO 902. The method uses a digital cycle counter 904 followed by sampling flip-flops 905 and 907 and a digital phase decoder 909. Sampling of the cycle counter's outputs is a variation of the asynchronous sampling scheme presented in J. Daniels, W. Dehaene and M. Steyaert, "All-digital differential VCO-based A/D conversion," *IEEE Int. Symp. Circuits Syst.*, pp. 1085-1088, June 2010. We provide a new phase decoder implementation of asynchronous sampling that is insensitive to initial conditions.

The cycle counter includes two counters 906 and 908 (of 4 bits each in this example). The counter with output $c_{pos}(t)$ is clocked with the rising edge of the RO's cell with output $d_1(t)$, whereas the counter with output $c_{neg}(t)$ is clocked with the falling edge of $d_1(t)$. On each rising edge of $v_{samp}(t)$, the counter outputs $c_{pos}(t)$ and $c_{neg}(t)$ are sampled to generate $c_{pos}[n]$ and $c_{neg}[n]$, and the RO outputs $d_1(t), d_2(t), \ldots, d_{127}(t)$ are sampled to generate $d_1[n], d_2[n], \ldots, d_{127}[n]$. The phase decoder consists of a lookup table (LUT) 910 that quantizes the sampled RO outputs to form a sequence, $p_F[n]$, which represents the fractional part of the sampled RO phase, and the overall logic in the phase decoder 909 computes $p_I[n]$, which represents the integer part of the sampled RO phase.

The top and bottom counters 906 and 908 in the cycle counter are clocked when $p_F[n]\cong 0$ and $p_F[n]\cong 126\Delta$, respectively, where $\Delta=1/254$ in the example case shown in FIG. 9. Hence, $p_F[n]$ can be used to determine which counter output was not changing when the sampling event occurred. As shown in FIG. 9, whenever the RO fractional phase, $p_F[n]$, is between $63\Delta$ and $189\Delta$, $p_I[n]$ is set to $c_{pos}[n]$. Ideally, $p_I[n]$ should be set to $c_{neg}[n]$ when $p_F[n]$ is between $190\Delta$ and $253\Delta$, and to $c_{neg}[n]+1$ when $p_F[n]$ is between 0 and $62\Delta$ so as to account for the bottom counter being clocked half an RO cycle after the top counter is clocked. Yet to work correctly this would require $c_{pos}(0)=c_{neg}(0)$ and the initial RO fractional phase to be such that the top counter is clocked before the bottom counter after startup, which are hard to ensure in practice.

These requirements are avoided via the $c_{corr}[n]$ correction logic 912. As both sampled counter outputs are reliable when $p_F[n]$ is around $63\Delta$ and $190\Delta$, the $c_{corr}[n]$ logic block 912 in FIG. 9 computes $$c_{corr}[n] = \begin{cases} c_{pos}[n] - c_{neg}[n] - 1, & \text{if } p_F[n] \in [53\Delta, 73\Delta], \\ c_{pos}[n] - c_{neg}[n], & \text{if } p_F[n] \in [180\Delta, 200\Delta], \\ c_{corr}[n-1] & \text{otherwise,} \end{cases} \quad (28)$$

and, as shown in FIG. 9, $p_I[n]$ is set to $c_{neg}[n]+c_{corr}[n]$ when $p_F[n]$ is between $190\Delta$ and $253\Delta$, to $c_{neg}[n]+c_{corr}[n]+1$ when $p_F[n]$ is between 0 and $62\Delta$, and to $c_{pos}[n]$ otherwise i.e, $$p_I[n] = \begin{cases} c_{neg}[n] + c_{corr}[n], & \text{if } p_F[n] \in [190\Delta, 253\Delta], \\ c_{neg}[n] + c_{corr}[n] + 1, & \text{if } p_F[n] \in [0\Delta, 62\Delta], \\ c_{pos}[n] & \text{otherwise.} \end{cases} \quad (29)$$

The sequences $p_I[n]$ and $p_F[n]$ are combined at the output of the phase decoder 909 to form the sequence p[n], which represents the sampled RO phase comprising both integer and fractional parts.

All arithmetic operations within the phase decoder 906 and its $c_{corr}[n]$ logic block 912, are performed with $2^C$-modular arithmetic, where C is the number of bits of the counters within the cycle counter 904 (e.g., C=4 in the example case shown in FIG. 9).

Incremental Frequency-Switching Controller

Figure 10A:
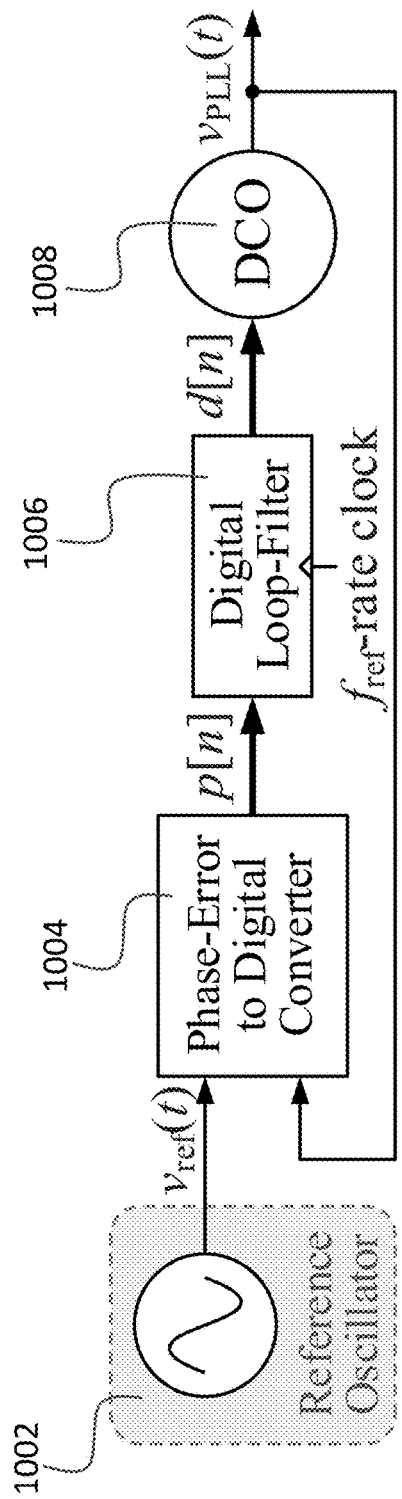
FIGS. 10A and 10B (Prior Art) show a PLL and a conventional controller for its DCO.
Figure 10B:
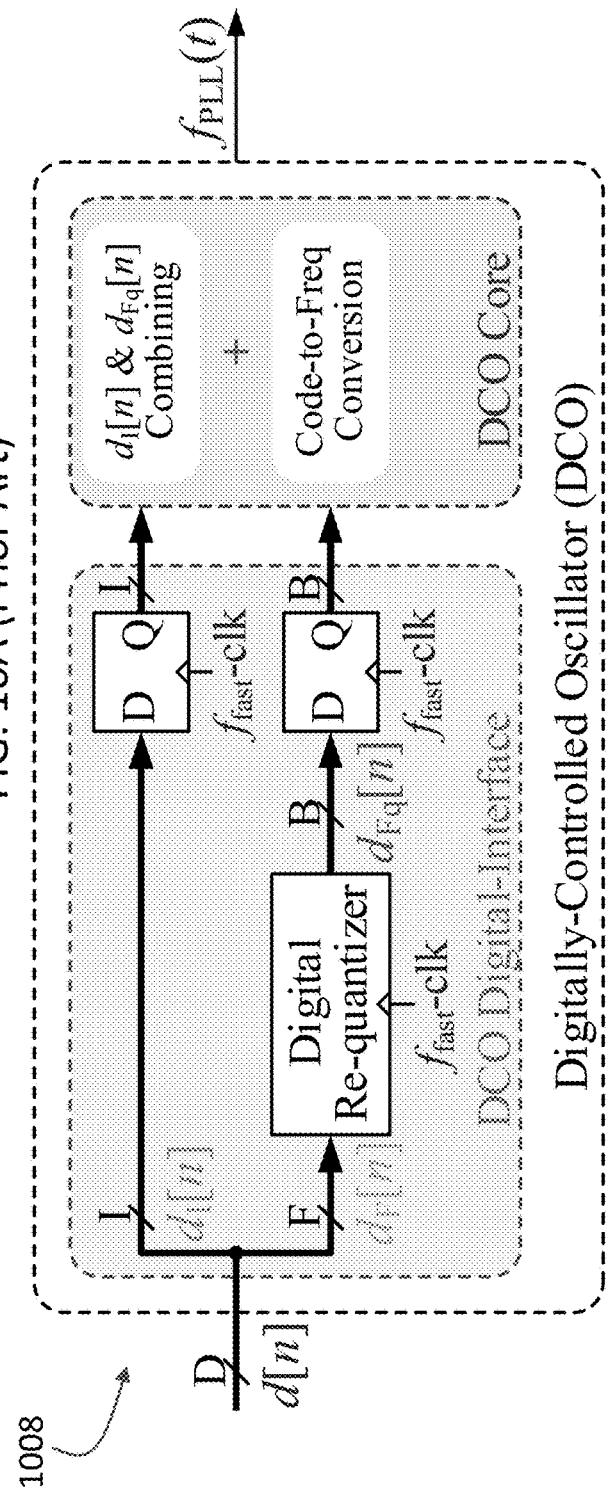

FIG. 10A shows a PLL including a DCO. FIG. 10B shows the basic structure of the a DCO.

In FIG. 10A, a reference oscillator 1002 generates an $f_{ref}$-rate periodic signal, $v_{ref}(t)$, which is used, along with the PLL's output $v_{PLL}(t)$, by the phase-error to digital converter (PEDC) 1004 to generate a quantized measure of the PLL's instantaneous phase error. The PEDC $f_{ref}$-rate output, p[n], is further lowpass filtered by the digital loop filter (DLF) 1006, whose output, d[n], is used to control the instantaneous frequency, $f_{PLL}(t)$, of a DCO 1008

In the DCO 1008, the minimum achievable frequency-step is dictated by the FCE's minimum frequency step size, $\Delta_{min}$, which, for many applications, is larger than the desired frequency step, $\Delta$. FIG. 10B shows a generalization of a common solution to this problem. The $f_{ref}$-rate D-bit sequence d[n] is split into two digital sequences, $d_I[n]$ and $d_F[n]$. $d_I[n]$ consists of the I-MSBs of d[n] and will be referred to as the integer-part of d[n] because it causes the DCO frequency to change by integer multiples of $\Delta_{min}$, whereas $d_F[n]$ consists of the F-LSBs of d[n] and will be referred to as the fractional-part of d[n] because it causes the DCO frequency to change in fractional-steps of $\Delta_{min}$.

To achieve frequency steps that are a fraction of $\Delta_{min}$, $d_F[n]$ is digitally re-quantized to an $f_{fast}$-rate (usually $f_{fast}>f_{ref}$) B-bit sequence, $d_{Fq}[n]$, where $d_{Fq}[n]$ is equal to $d_F[n]$ plus some quantization error, usually high-pass shaped. The parameters $\Delta_{min}$, F, B, $f_{fast}$ and the digital re-quantizer architecture are chosen such that the extra noise resulting from the quantized frequency-tuning process does not deteriorate the PLL's phase noise profile.

Figure 11:
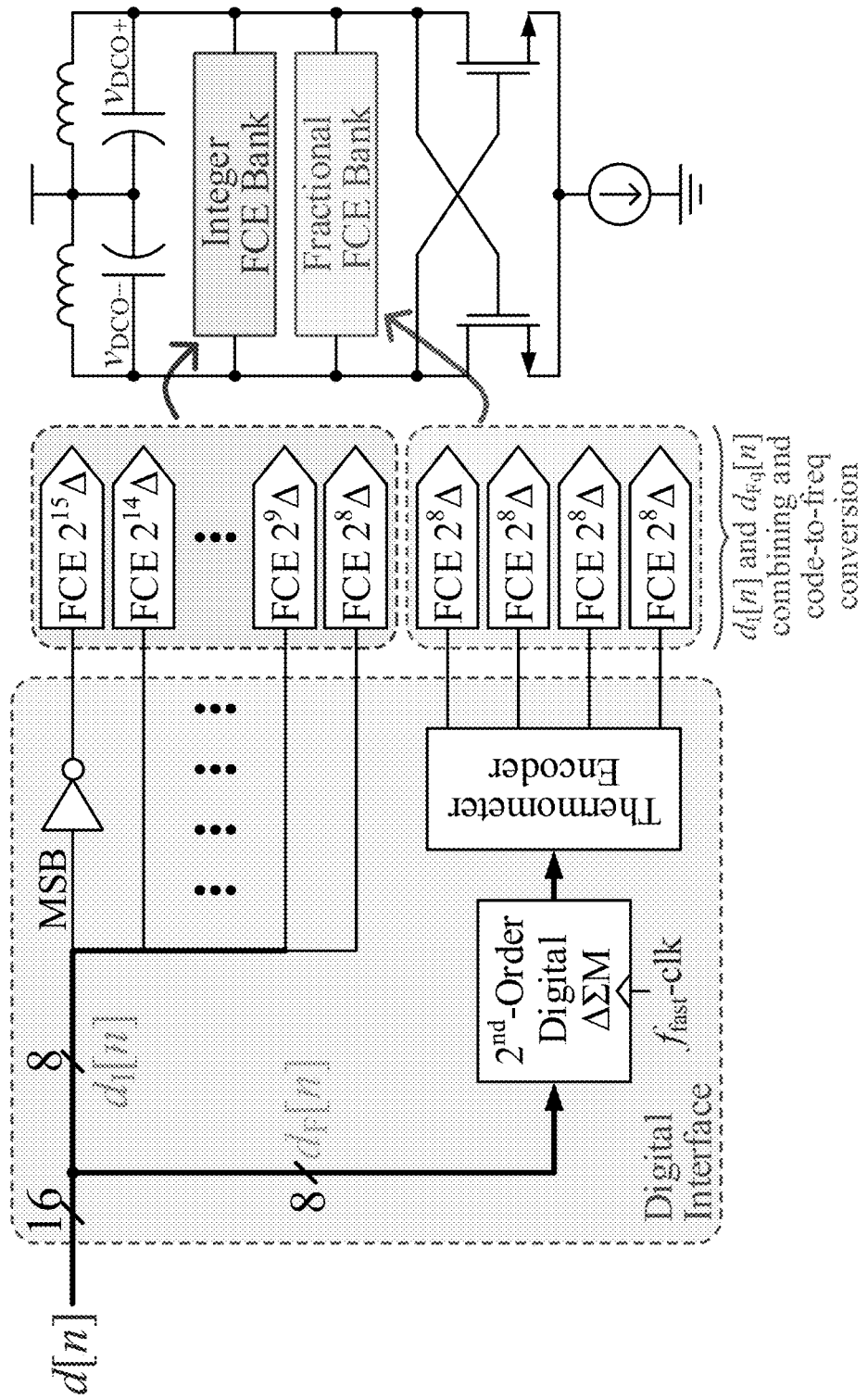
FIG. 11 (Prior Art) shows a conventional PLL controller.

The way $d_I[n]$ and $d_{Fq}[n]$ are combined and translated into DCO frequency changes depends on the DCO topology. FIG. 11 shows an example for the frequency control in an LC-DCO. In the example, the FCE's minimum frequency-step $\Delta_{min}=2^8\Delta$, where $\Delta$ is the desired frequency step. This requires the split of the two's complement 16-bit sequence d[n] into two 8-bit sequences, $d_I[n]$ and $d_F[n]$. The digital re-quantizer is implemented as a second-order digital $\Delta\Sigma$ modulator ($\Delta\Sigma$M), and $d_{Fq}[n]$ is further thermometer encoded. Each of $d_I[n]$ and $d_{Fq}[n]$ control an array of FCEs, where each FCE adds to or subtracts from the total tank capacitance, depending on its digital input, hence, controlling the DCO's frequency.

While in the acquisition-mode, the PLL's negative feedback mechanism tries to set d[n] to the right value such that the DCO runs at the desired frequency. During this phase, d[n] experiences a transient behavior determined by the PLL's initial conditions and loop dynamics and changes in $d_I[n]$ are normal. Once lock is acquired, d[n] converges to a constant number whose value sets the PLL to run at the desired frequency, and the PLL is said to run in the tracking-mode. In this mode, d[n] would vary around this constant value in response to the PLL's phase error in addition to other noise terms incurred during the PEDC process. In many applications, the low-noise system-level requirements imply that $d_I[n]$ remains constant, and only $d_F[n]$ would change in response to the noise sources in the PLL. Occasionally, however, $d_I[n]$ would change due to the DCO's flicker noise and temperature induced frequency drifts, but this happens at a much lower rate than the changes in $d_F[n]$.

Figure 12:
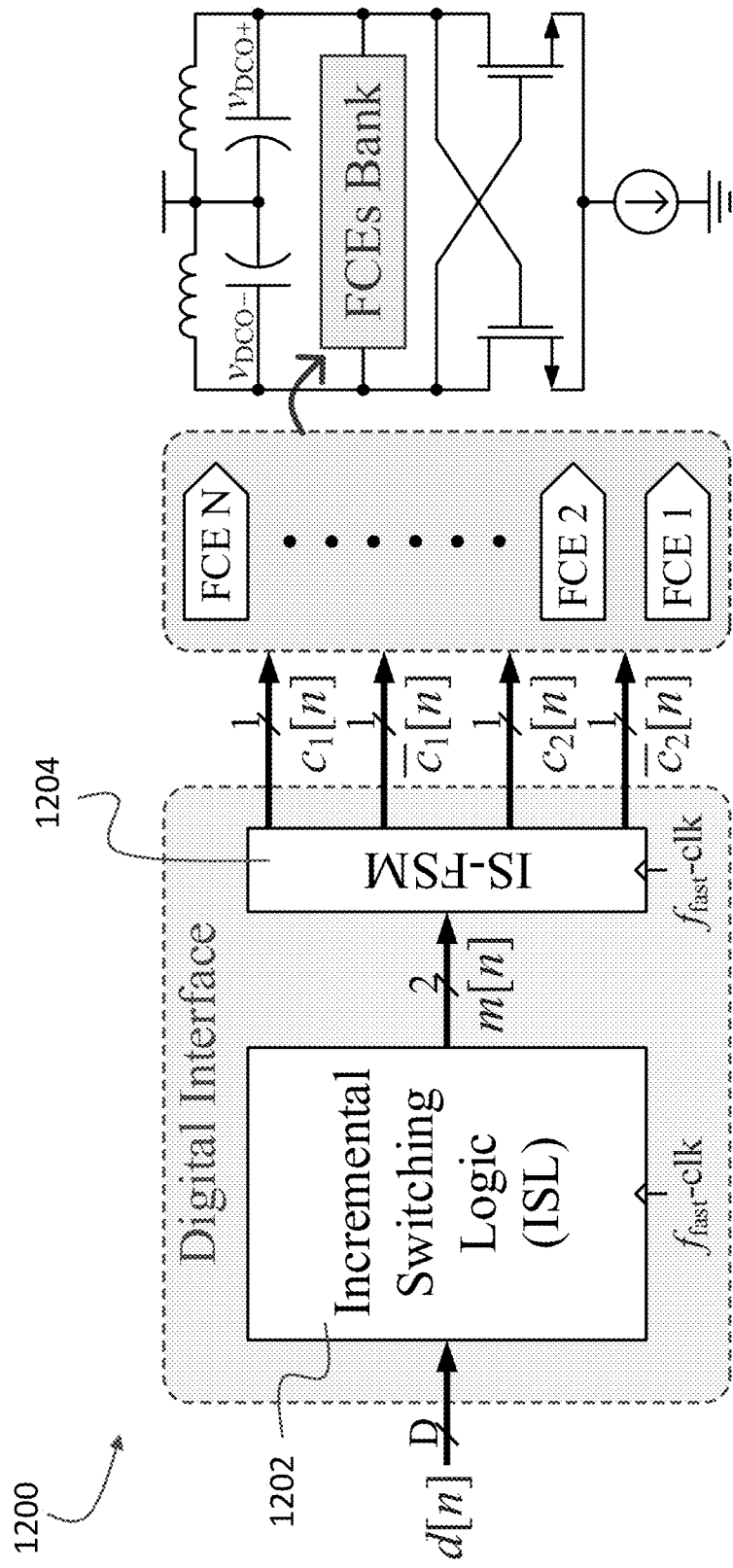
FIG. 12 shows a preferred incremental frequency-switching controller for the DCO in the FIG. 10A or FIG. 1 PLL.

FIG. 12 shows a preferred IFS controller 1200 in the context of controlling an LC-DCO like that shown in FIGS. 10A and 10B. The DCO's frequency is controlled by an array of N equally weighted FCEs where each FCE adds to or subtracts from the overall tank capacitance (a change in an FCE's state from 0 to 1 corresponds to an increase in the DCO's running frequency by $\Delta_{min}$). The FCE bank is controlled by the signals $c_1[n]$ and $c_2[n]$ and their inverted versions. The signals $c_1[n]$ and $c_2[n]$ are generated within the DCO's digital interface, which has incremental-switching logic (ISL) 1202 and an incremental-switching finite-state machine (IS-FSM) 1204.

Figure 13:
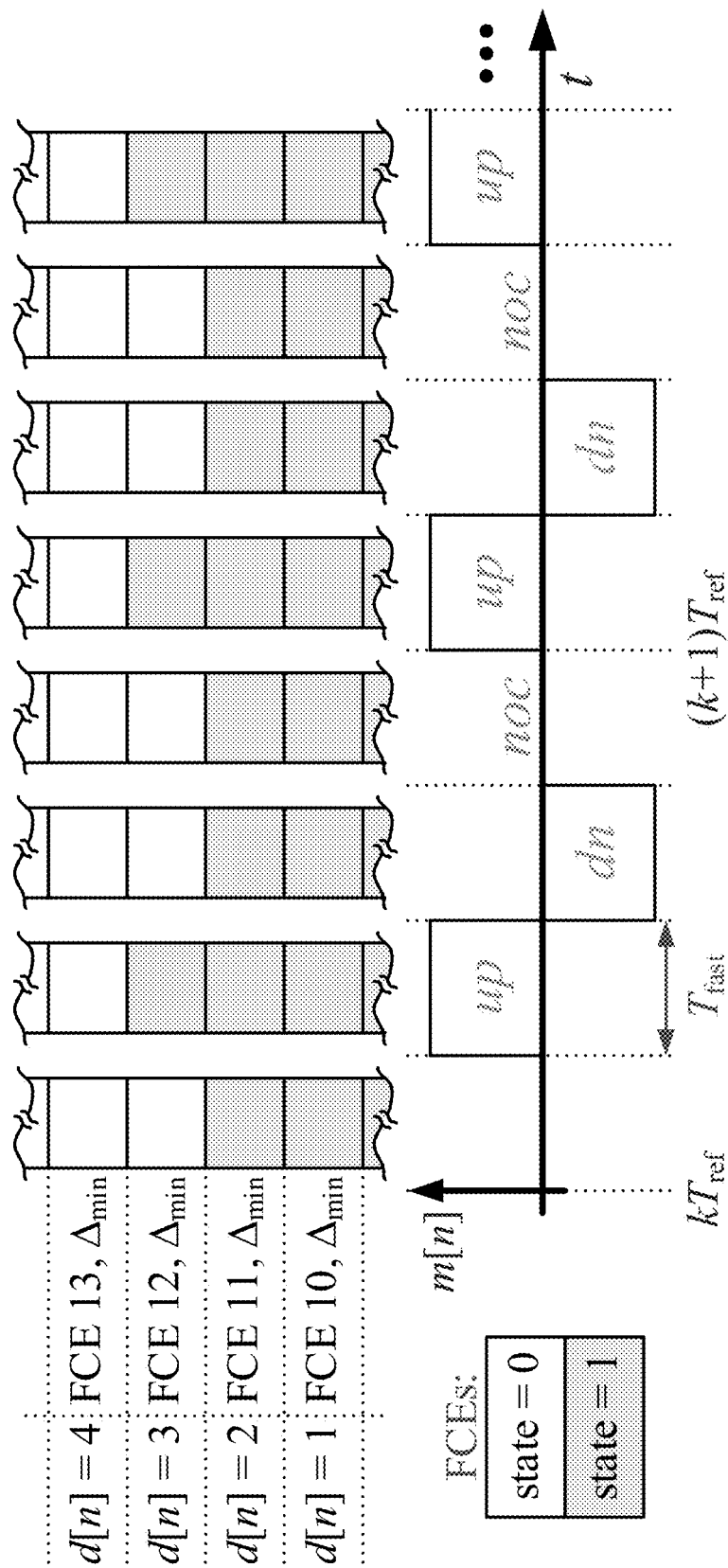
FIG. 13 is an example that describes operation of the incremental frequency-switching controller of FIG. 12.

FIG. 13 is illustrative example describing how the IFS controller 1200 operates. In this example, the DCO's digital interface is clocked at a rate $f_{fast}=f_{PLL}/5$, the PLL's frequency $f_{PLL}=20f_{ref}$, d[k] and d[k+1] are 2.25 and 2.5, respectively, and the FCE bank has 20 equally-weighted elements, FCE0 to FCE19, where d[n]=0 corresponds to the first 10 elements having a "1" state. For the DCO to have the right "average" frequency, in this example, the 12$^{th}$ FCE must have a "1" state once and twice over the k$^{th}$ and (k+1)$^{th}$ reference periods, respectively. In the IFS control scheme, $c_1[n]$ and $c_2[n]$ control the whole FCE bank in accordance to the "move" signal, m[n], which dictates the number of FCEs having a "1" state to increment (go up) by one, decrement (go dn) by one, or to not change (noc). The ISL output the signal m[n] that takes on a value of −1, 0, or 1, corresponding to a decrease in the DCO's frequency by $\Delta_{min}$ (dn), no frequency change at all (noc), or an increase by $\Delta_{min}$ (up), respectively. The IS-FSM generates $c_1[n]$ and $c_2[n]$ (and their inverted versions), each taking on a value of 0, or 1, based on m[n], $c_1[n-1]$ and $c_2[n-1]$.

The DCO 1008 (FIG. 10A) can be implemented as an analog LC-oscillator whose frequency is controlled by digitally changing the state of the FCE bank's unit cells. The oscillator consists of an inductor, a fixed capacitance, an NMOS cross-coupled transistor pair, and a tail current source. The IFS scheme, however, can be applied to any DCO topology whose frequency can be tuned by discrete switching of an FCE where a change in the FCE's binary-state results in either an increase or a decrease in the oscillator's frequency.

Figure 14A:
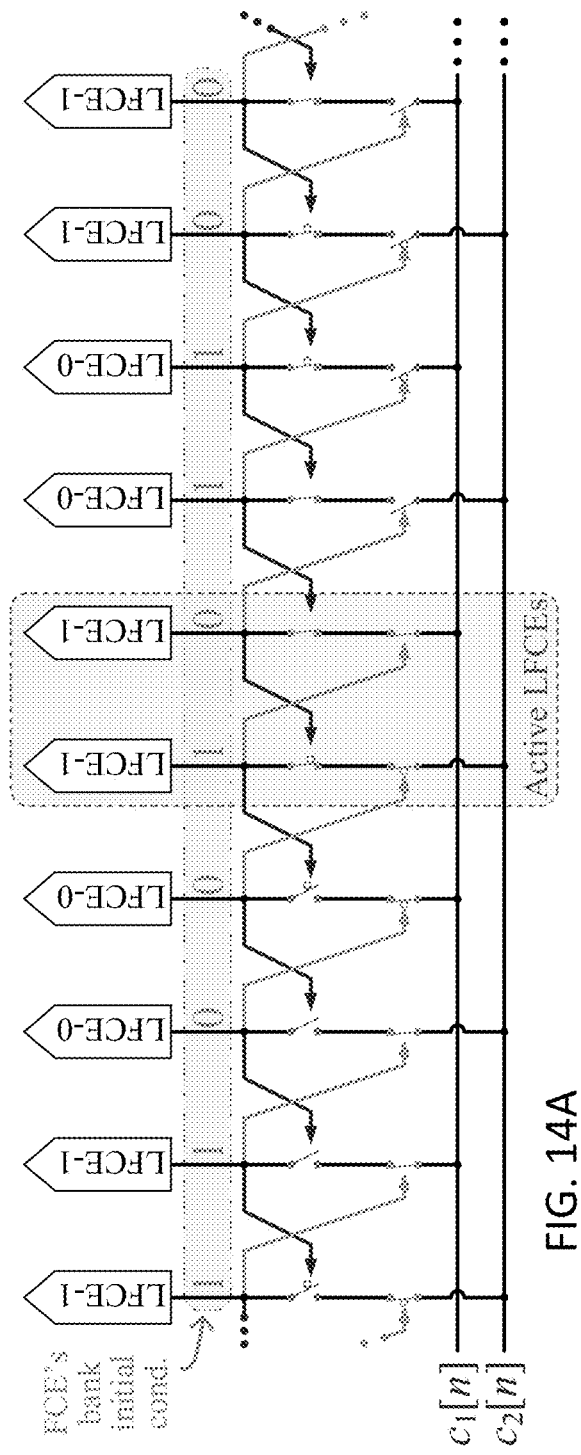
FIG. 14A shows a bank topology implementation of the DCO of FIG. 10A.
Figure 14B:
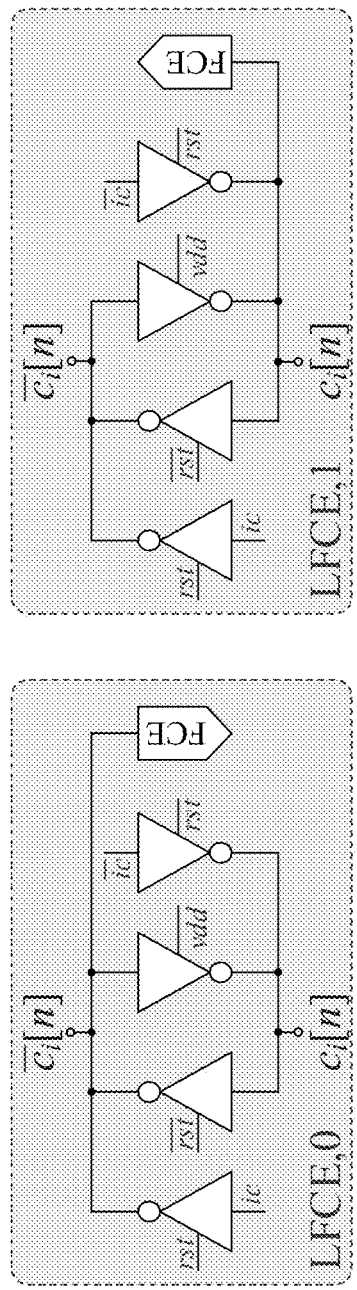
FIG. 14B shows details of the latched-FCEs.

FIG. 14A shows the FCE bank which consists of N nominally identical unit cells. In the shown version, each unit cell is controlled by either $c_1[n]$ or $c_2[n]$, in an alternating fashion, through an intra-network of switches. In the fully differential version, each unit is differentially controlled by $c_i[n]$, where i=1 or 2, and its inversion. The FCE bank uses a modified FCE unit which will be referred to as latched-FCE (LFCE), and in the presented scheme there are two types of LFCEs, LFCE-0 and LFCE-1. FIG. 14B shows the LFCEs' details. An LFCE is a regular FCE whose control voltage is latched by a pair of cross-coupled tri-state inverters to keep the FCE's control logic value when the FCE cell is disconnected from its respective control signal. Both LFCE types are identical except for the polarity of $c_i[n]$ that controls the FCE's state. In LFCE-0 (LFCE-1), a control state 0 (1) results in an increase in the DCO's frequency. The FCE bank has the LFCE-x units arranged such that x follows the pattern { ..., 1, 0, 0, 1, 1, 0, 0, 1, ... } for reasons that will be explained shortly. In this implementation, each FCE has a topology to achieve small frequency steps, but any other switched-capacitor topology could have been used. The FCE bank frequency increases monotonically as the number of FCEs with a "1" state increases (as in thermometer coded schemes) and is initialized at mid-frequency as shown in FIG. 5A. A global reset signal (rst) is used to initialize the FCE bank to its hard-coded initial conditions (ic). In a variation, the DCO has multiple banks of FCEs, each of which is controlled by its own two-wire interface.

The switches' network guarantees that only two LFCEs are active over every $f_{fast}$ clock period, i.e., only two LFCEs are accessible by the control signals, one through $c_1[n]$ and the other through $c_2[n]$. The switches arrangement that achieves such functionality is shown in FIG. 14A. Since over each $f_{fast}$ clock period we have access to two FCEs, one at state "0" and the other at state "1", the IFS controller 1200 can be easily implemented. For the setting shown in FIG. 14A, the DCO's frequency can move up, dn, or noc by setting the logic states of $c_i[n]$ and $c_2[n]$ to (1, 1), (0, 0), or ($c_1[n-1]=0$, $c_2[n-1]=1$), respectively. The LFCE-x pattern, x={ ..., 1, 0, 0, 1, 1, 0, 0, 1, ... }, is intentionally chosen to avoid short-circuiting two different LFCE states during control signals' transitions. In this implementation, the switches in FIG. 14A are implemented using CMOS-switches.

Figure 15A:
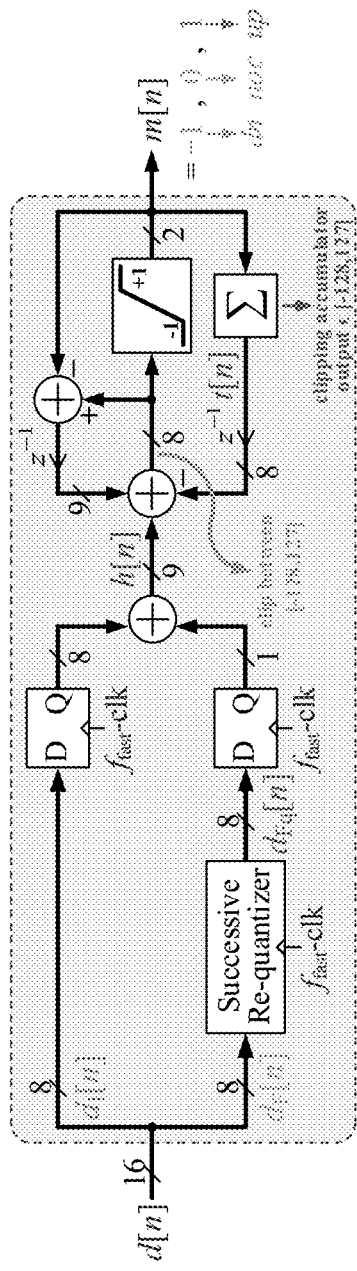
FIG. 15A shows details of a preferred incremental frequency-switching controller implementation for the FIG. 12 incremental frequency-switching controller and FIG. 15B a state diagram for operation.

Without loss of generality, the digital blocks' bus widths and signal processing details are presented within the context of an implementation example. FIG. 15A shows details of a preferred ISL implementation and FIG. 15B a state diagram for operation. For a desired minimum frequency step=$2^{-8}\Delta_{min}$, the 16-bit two's complement sequence d[n] is split into its integer and fractional parts, $d_I[n]$ and $d_F[n]$, respectively, each of which is an 8-bit $f_{ref}$-rate sequence. A successive re-quantizer which can be configured to have first- or second-order high-pass shaped quantization error is used to generate the $f_{fast}$-rate sequence $d_{Fq}[n]$ which can take on values of 0 or 1. $d_{Fq}[n]$ is added to an $f_{fast}$-rate up-sampled and zero-order held version of $d_I[n]$ generating the sequence h[n] which represents the number of FCEs that should have a "1" state over a given fast clock period. To generate m[n], h[n] is compared to the current number of FCEs with "1" state, t[n−1] (a delayed and accumulated version of m[n]), to determine how many increments/decrements are needed. As explained above, usually the increments/decrements are limited to unity. In the occasional case where increments/decrements by more than one are needed, the difference between h[n] and t[n−1] is clipped to +1, since the FCE bank topology can only handle increments/decrements by one, and the difference is added to the next cycle as if the changes in h[n] where "serialized". Since this scenario might only take place during the PLL's acquisition mode or at a very slow rate when $d_1[n]$ crosses an integer-boundary, the serialization action has no significant impact on the DCO's phase noise profile.

Figure 15B:
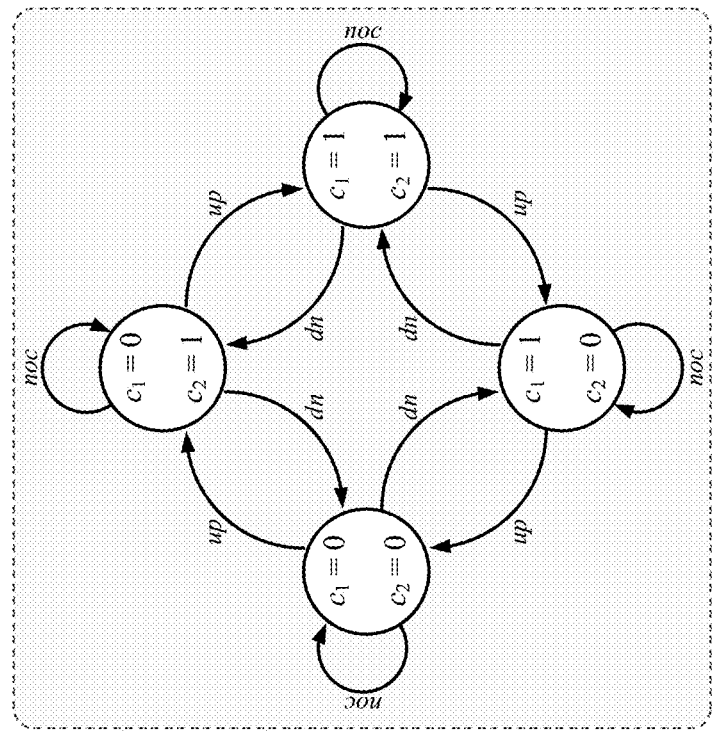

Once m[n] is ready, the FCE bank control signals $c_1[n]$ and $c_2[n]$ are generated by the IS-FSM. The IS-FSM finite-state transition diagram is shown in FIG. 15B where $c_i[n]$, for i=and 2, and their inverted versions are generated based on m[n] (up/dn/noc), $c_1[n-1]$ and $c_2[n-1]$. Notice that either $c_1[n]$ or $c_2[n]$ changes its state at any given transition but not both, reducing the number of toggling digital lines controlling the FCE array to its minimum. This happens independent of the DCO's input code word and of any timing mismatches, alleviating a fundamental problem in prior DCO frequency switching schemes. The present controller uses a pair of differential digital control signals to control the whole FCE bank, where at most one of the control signals-changes its state at a time. This property is maintained across all DCO input values and is immune to any inevitable timing mismatches. The controller adds minimal hardware to existing FCE topologies which makes it suitable for low-power and small-area applications.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A delta-sigma frequency-to-digital converter, comprising:
   a phase-frequency detector that receives a periodic reference signal;
   a dual-mode ring oscillator driven by an output of the phase-frequency detector;
   a ring phase calculator that samples outputs of the dual-mode ring oscillator to calculate phase of the dual-mode ring oscillator;
   digital background calibration in the ring phase calculator that allows the dual-mode ring oscillator to operate without analog correction of its frequency, wherein the digital background calibration comprises a signed least-mean square (LMS)-like loop with gain K and output $g_n$, which digitally compensates for forward path gain error caused by $\delta \neq 1$ (forward gain in the absence of gain correction);
   within the ring phase calculator, digital feedback to an accumulator in the ring phase calculator that provides the converter output; and
   feedback of a delayed version of the converter output through a divider to the phase-frequency detector.

2. The converter of claim 1, further comprising an adder to subtract a constant from an input of the accumulator, the constant being selected to force average frequency of the dual-mode ring oscillator to its reference frequency.

3. The converter of claim 1, wherein the dual-mode ring oscillator operates in a fixed frequency range with fixed values of the high and low frequencies without analog gain correction from feedback in the dual-mode ring oscillator.

4. The converter of claim 1, wherein the digital background calibration comprises a feedback loop driven by an intermediate node of the ring phase calculator that compensates for $\Delta\Sigma$ FDC forward path gain error b caused by non-ideal DMRO frequencies.

5. A delta-sigma frequency-to-digital converter, comprising:
   a phase-frequency detector that receives a periodic reference signal;
   a dual-mode ring oscillator driven by an output of the phase-frequency detector;
   a ring phase calculator that samples outputs of the dual-mode ring oscillator to calculate phase of the dual-mode ring oscillator;
   within the ring phase calculator, digital feedback to an accumulator in the ring phase calculator that provides the converter output; and
   feedback of a delayed version of the converter output through a divider to the phase-frequency detector, wherein the ring phase calculator comprises:
   a cycle counter and phase decoder that samples the outputs of the dual-mode ring oscillator;
   a differentiator that generates phase change of the dual-mode ring oscillator over a period of the periodic reference signal;
   a first adder adding a constant to the output of the differentiator;
   a multiplier that multiples an output of the first adder;
   a second adder adding a correction sequence to an output of the multiplier and the digital feedback; and
   an accumulator that receives output of the second adder.

6. A delta-sigma frequency-to-digital converter, comprising:
   a phase-frequency detector that receives a periodic reference signal;
   a dual-mode ring oscillator driven by an output of the phase-frequency detector;
   a ring phase calculator that samples outputs of the dual-mode ring oscillator to calculate phase of the dual-mode ring oscillator;
   within the ring phase calculator, digital feedback to an accumulator in the ring phase calculator that provides the converter output; and
   feedback of a delayed version of the converter output through a divider to the phase-frequency detector, wherein the converter is in a phase-locked loop (PLL), wherein an output span of the phase-frequency detector is smaller than twice the period of PLL output.

7. A delta-sigma frequency-to-digital converter, comprising:
- a phase-frequency detector that receives a periodic reference signal;
- a dual-mode ring oscillator driven by an output of the phase-frequency detector;
- a ring phase calculator that samples outputs of the dual-mode ring oscillator to calculate phase of the dual-mode ring oscillator;
- within the ring phase calculator, digital feedback to an accumulator in the ring phase calculator that provides the converter output; and
- feedback of a delayed version of the converter output through a divider to the phase-frequency detector, wherein the divider loads its modulus near a beginning of the current count.

8. The converter of claim 5, comprising digital background calibration in the ring phase calculator that allows the dual-mode ring oscillator to operate without analog correction of its frequency.

9. The converter of claim 1, wherein the digital background calibration ramps $g_n$ (gain calibration output) up or down until an input to the accumulator reaches zero-mean noise.

10. The converter of claim 1, wherein the digital background calibration comprises a signed least-mean square (LMS)-like loop with gain K and output $g_n$, which digitally compensates for forward path gain error caused by $\delta \neq 1$ (forward gain in the absence of gain correction).

11. A delta-sigma frequency-to-digital converter, comprising:
- a phase-frequency detector that receives a periodic reference signal;
- a dual-mode ring oscillator driven by an output of the phase-frequency detector;
- a ring phase calculator that samples outputs of the dual-mode ring oscillator to calculate phase of the dual-mode ring oscillator;
- within the ring phase calculator, digital feedback to an accumulator in the ring phase calculator that provides the converter output; and
- feedback of a delayed version of the converter output through a divider to the phase-frequency detector, wherein the ring phase calculator comprises a ring oscillator delay-free asynchronous phase sampler sampling outputs of an RO comprising:
- a cycle counter with two counters clocked by the rising and falling edges, respectively, of the output of the RO;
- a phase decoder to process the outputs of the RO and to select a sampled counter output that was not changing when the sampling event occurred;
- correction logic to compensate for arbitrary initial conditions of the RO and counters within the cycle counter.

12. The sampler of claim 11, wherein the phase decoder comprises:
- a look-up table (LUT) to form a sequence that represents a sampled fractional phase of the RO;
- correction logic to compute a difference between sampled outputs of the cycle counter; and
- logic to determine sampled RO integer phase from an output of the correction logic and the sampled outputs of the cycle counter.

13. A frequency-to-digital converter, comprising:
- a phase-frequency detector that receives a periodic reference signal;
- a charge pump that charges and discharges a capacitor;
- a one-shot circuit that prevents the magnitude of the charge pump output to grow without bound;
- an analog-to-digital converter driven by an output of the charge pump;
- a multi-modulus divider providing feedback to the phase-frequency detector; and
- digital background calibration provided by multiplier at the output of the analog-to-digital converter to correct for deviations of charge pump currents and capacitance of capacitor from their ideal values.

14. A ring oscillator delay-free asynchronous phase sampler sampling outputs of a ring oscillator (RO) comprising:
- a cycle counter with two counters clocked by the rising and falling edges, respectively, of the output of the RO;
- a phase decoder to process the outputs of the RO and to select a sampled counter output that was not changing when the sampling event occurred;
- correction logic to compensate for arbitrary initial conditions of the RO and counters within the cycle counter.

15. The sampler of claim 14, wherein the phase decoder comprises:
- a look-up table (LUT) to form a sequence that represents a sampled fractional phase of the RO;
- correction logic to compute a difference between sampled outputs of the cycle counter; and
- logic to determine sampled RO integer phase from an output of the correction logic and the sampled outputs of the cycle counter.

16. A digitally-controlled oscillator (DCO) control method, comprising:
- increasing or decreasing the DCO frequency by changing the state of one its frequency control elements (FCEs), wherein the DCO comprises a bank of FCEs that control the DCO frequency, the FCE bank having an array of latched-FCEs (LFCEs), wherein the array of LFCEs is connected to control signals through an intra-network of switches, with each top switch being controlled by the state of the LFCE to its right (or an inverted version of it) and each bottom switch being controlled by the state of the LFCE to its left (or an inverted version of it), wherein a DCO digital interface includes an incremental switching logic (ISL) and an incremental-switching finite-state-machine (IS-FSM);
- via the DCO digital interface, accepting an input code word and outputting two control signals and their inverted versions to control the FCE bank; and
- via the ISL, splitting the input codeword into its integer and fractional parts, digitally re-quantizing the fractional part and adding it to the integer part of the input codeword.

17. The DCO control method of claim 16, comprising passing an output of the ISL operation through control logic including a clipper, an accumulator, a carry-generator and an adder.

18. The DCO control method of claim 17, comprising the control logic outputting changes in its input and adding the carry to the next sample, to serialize a change in the control logic input.

19. The DCO control method of claim 18, wherein the changes in its input are limited to $\pm 1$ and an output of the ISL is a signal that takes on values from $\{-1, 0, 1\}$ and is passed to the IS-FSM, wherein the IS-FSM generates the two control signals and their inverted versions that control the array of LFCEs.

* * * * *